United States Patent
Namekawa et al.

(10) Patent No.: US 7,505,300 B2
(45) Date of Patent: Mar. 17, 2009

(54) NONVOLATILE SEMICONDUCTOR MEMORY DEVICE USING NONVOLATILE STORAGE ELEMENTS TO WHICH DATA CAN BE WRITTEN ONLY ONCE

(75) Inventors: Toshimasa Namekawa, Tokyo (JP); Hiroshi Ito, Yokohama (JP); Hiroaki Nakano, Yokohama (JP); Osamu Wada, Yokohama (JP); Atsushi Nakayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 162 days.

(21) Appl. No.: 11/733,933

(22) Filed: Apr. 11, 2007

(65) Prior Publication Data
US 2008/0062782 A1    Mar. 13, 2008

(30) Foreign Application Priority Data
Sep. 11, 2006    (JP)    ............................. 2006-245908

(51) Int. Cl.
*G11C 17/00*    (2006.01)
(52) U.S. Cl. .......................................... 365/94; 365/96
(58) Field of Classification Search ................... 365/94, 365/96, 225.7
See application file for complete search history.

(56) References Cited

U.S. PATENT DOCUMENTS

| | | | |
|---|---|---|---|
| 5,208,780 A | * | 5/1993 | Iwase et al. ............... 365/225.7 |
| 7,046,569 B2 | | 5/2006 | Ito et al. |
| 2006/0133127 A1 | | 6/2006 | Nakano et al. |
| 2006/0133167 A1 | | 6/2006 | Nakayama et al. |
| 2006/0158923 A1 | | 7/2006 | Namekawa et al. |

FOREIGN PATENT DOCUMENTS

JP    2003-131951    5/2003

OTHER PUBLICATIONS

U.S. Appl. No. 11/733,933, filed Apr. 11, 2007, Namekawa, et al.
U.S. Appl. No. 11/839,199, filed Aug. 15, 2007, Matsufuji, et al.

* cited by examiner

*Primary Examiner*—Vu A Le
(74) *Attorney, Agent, or Firm*—Oblon, Spivak, McClelland, Maier & Neustadt, P.C.

(57) ABSTRACT

A nonvolatile semiconductor memory device includes a nonvolatile storage element to which data is inhibited from being rewritten, a read operation control circuit which captures a read operation instruction signal in synchronization with an external input clock, and a write operation control circuit to which a write operation instruction signal is input asynchronously with the external input clock. The read operation instruction signal gives an instruction to start a read operation to read data out of the nonvolatile storage element, and the write operation instruction signal gives an instruction to start a write operation to write data to the nonvolatile storage element. The device further includes a reset circuit which resets an operation of the read operation control circuit upon receiving the write operation instruction signal.

20 Claims, 18 Drawing Sheets

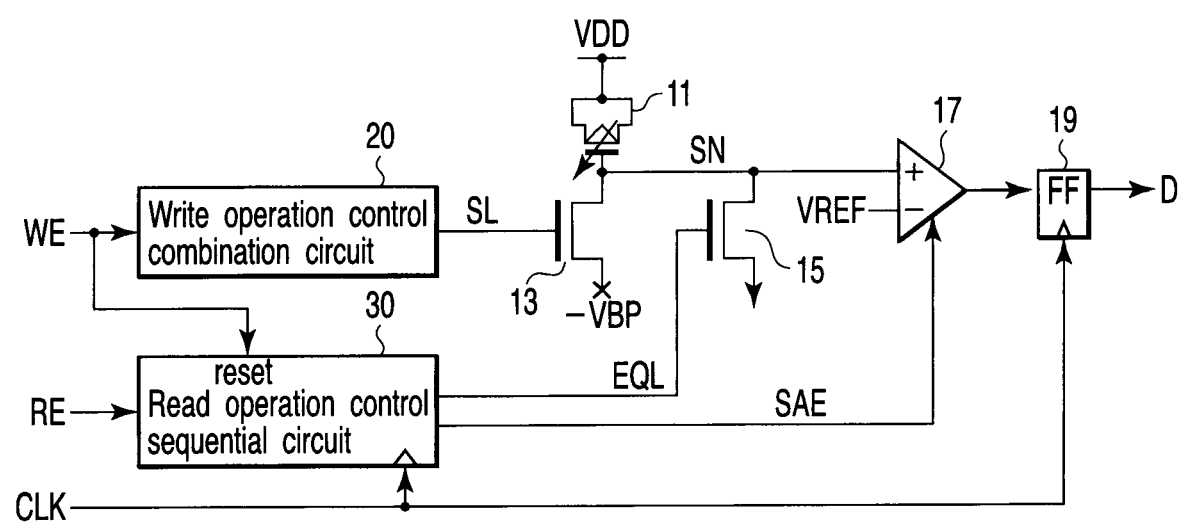
F I G. 1

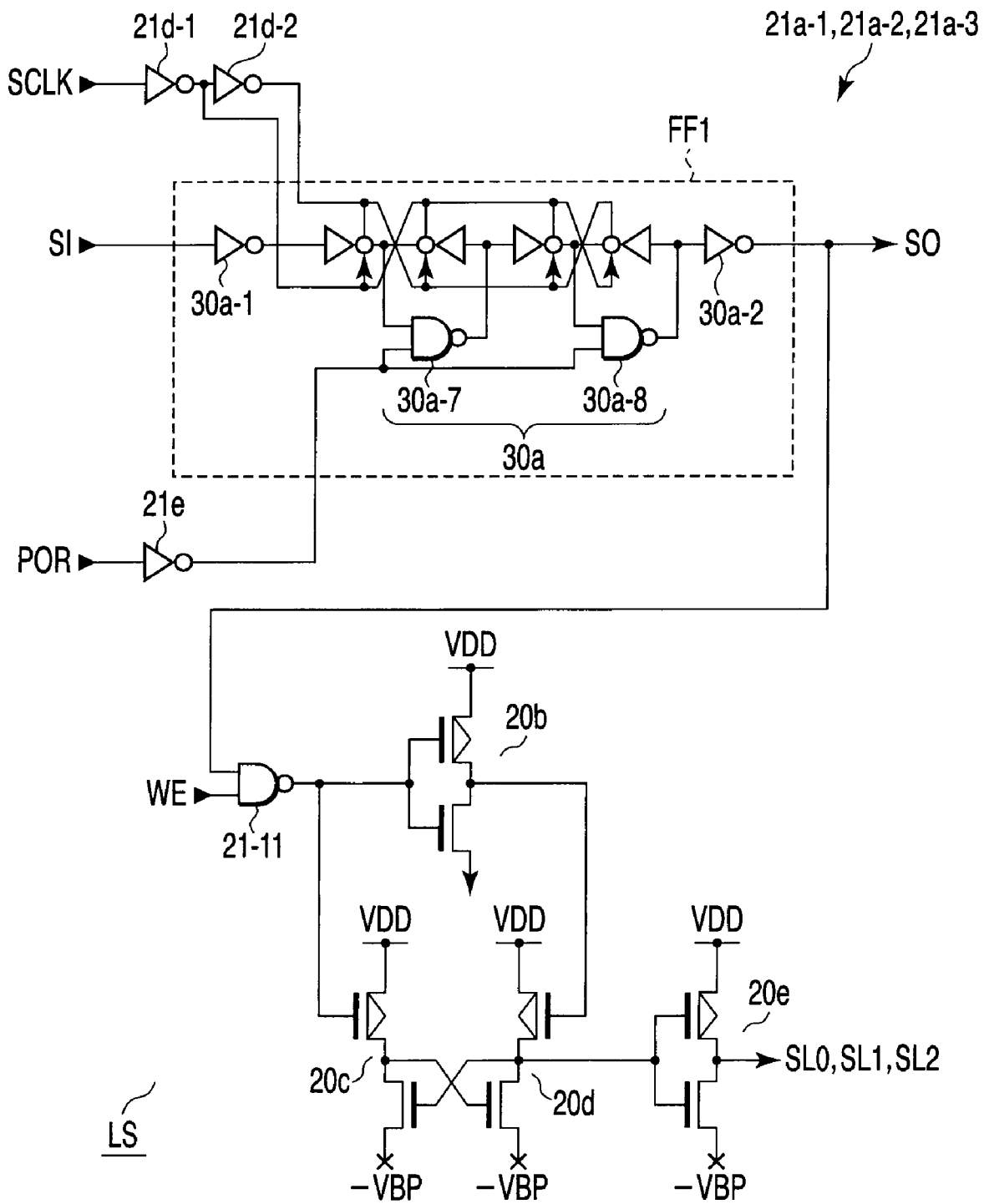
F I G. 15

NONVOLATILE SEMICONDUCTOR MEMORY DEVICE USING NONVOLATILE STORAGE ELEMENTS TO WHICH DATA CAN BE WRITTEN ONLY ONCE

CROSS-REFERENCE TO RELATED APPLICATIONS

This application is based upon and claims the benefit of priority from prior Japanese Patent Application No. 2006-245908, filed Sep. 11, 2006, the entire contents of which are incorporated herein by reference.

BACKGROUND OF THE INVENTION

1. Field of the Invention

The present invention relates to a nonvolatile semiconductor memory device. More specifically, the invention relates to a nonvolatile semiconductor memory device, such as a so-called one-time programmable memory, using nonvolatile storage elements to which data can be written only once.

2. Description of the Related Art

Conventionally, one important object of a nonvolatile semiconductor memory device that can hold data even after its power is turned off is to prevent data from being lost due to a malfunction caused when the power is turned off or it is turned on again. The object is more important particularly to a one-time programmable memory to which data can be written only once or no data can be rewritten. The object becomes more important to a nonvolatile semiconductor memory device using a fuse element or an anti-fuse element to which data is written using a high-current power supply and a high-voltage power supply, because a write control circuit malfunctions to not only lose data but also break the device (semiconductor elements of the circuit).

The above malfunction of the write control circuit is caused by an unexpected operation thereof. Conventional nonvolatile semiconductor memory devices have employed a so-called protection circuit with a function such as a key and a password to inhibit a write control circuit from operating without executing normal procedures. Such a protection circuit is however complicated in general. For example, a sequential circuit is often used to confirm that normal procedures have been executed in sequence. However, the malfunction of the write control circuit is caused chiefly by an unstable state of a power supply when it is turned off or turned on again. The protection circuit complicates the write control circuit, and the sequential circuit weakens the write control circuit.

Assume here that a protection circuit is configured as follows. The protection circuit is supplied with KEY [2:0] corresponding to three input signals. If KEY [2:0] is first brought into "010" state and the circuit is supplied with a clock CLK, the first key is released. If KEY [2:0] is then brought into "101" state and the circuit is supplied with a clock CLK again, a write operation starts. Such a protection circuit always includes a sequential circuit using a flip-flop. However, the sequential circuit generally becomes unstable immediately after power is turned on. The flip-flop could be brought into an unexpected state by the influence of radiation or the like. The protection circuit therefore fills the role of preventing an unauthorized write operation while the sequential circuit is normally operating; however, it cannot prevent an unauthorized write operation due to a malfunction of the sequential circuit. Adding a power-on reset circuit that monitors the state of a power supply and generates a reset signal, the initial state of the protection circuit can be determined. The protection circuit is thus improved in advantage (accuracy) accordingly. However, the power-on reset circuit is not advantageous to any malfunction due to radiation or its operation is not performed stably.

A nonvolatile memory including an address holding circuit having a reset signal input has been proposed (refer to Jpn. Pat. Appln. KOKAI Publication No. 2003-131951, for example). However, the nonvolatile memory is configured to reliably prevent data from being written to the memory or erased therefrom when a reset signal is generated during the execution of a write sequence or an erase sequence.

BRIEF SUMMARY OF THE INVENTION

According to a first aspect of the present invention, there is provided a nonvolatile semiconductor memory device comprising a nonvolatile storage element to which data is inhibited from being rewritten, a read operation control circuit which captures a read operation instruction signal in synchronization with an external input clock, the read operation instruction signal giving an instruction to start a read operation to read data out of the nonvolatile storage element, a write operation control circuit to which a write operation instruction signal is input asynchronously with the external input clock, the write operation instruction signal giving an instruction to start a write operation to write data to the nonvolatile storage element, and a reset circuit which resets an operation of the read operation control circuit upon receiving the write operation instruction signal.

According to a second aspect of the present invention, there is provided a nonvolatile semiconductor memory device comprising a nonvolatile storage element to which data is inhibited from being rewritten, an oscillator to which a read operation instruction signal is input in synchronization with an external input clock, the read operation instruction signal giving an instruction to start a read operation to read data out of the nonvolatile storage element, a read operation control circuit which captures an internal read operation instruction signal output from the oscillator, as the read operation instruction signal, in synchronization with an internal clock of the oscillator, a write operation control circuit to which a write operation instruction signal is input asynchronously with the external input clock, the write operation instruction signal giving an instruction to start a write operation to write data to the nonvolatile storage element, and a reset circuit which resets an operation of the read operation control circuit upon receiving the write operation instruction signal.

BRIEF DESCRIPTION OF THE SEVERAL VIEWS OF THE DRAWING

FIG. 1 is a circuit diagram showing a configuration of a nonvolatile semiconductor memory device (one-time programmable memory) according to a first embodiment of the present invention;

FIG. 15 is a circuit diagram showing a configuration of a write operation control combination circuit in the memory shown in FIG. 14;

DETAILED DESCRIPTION OF THE INVENTION

Figure 2:
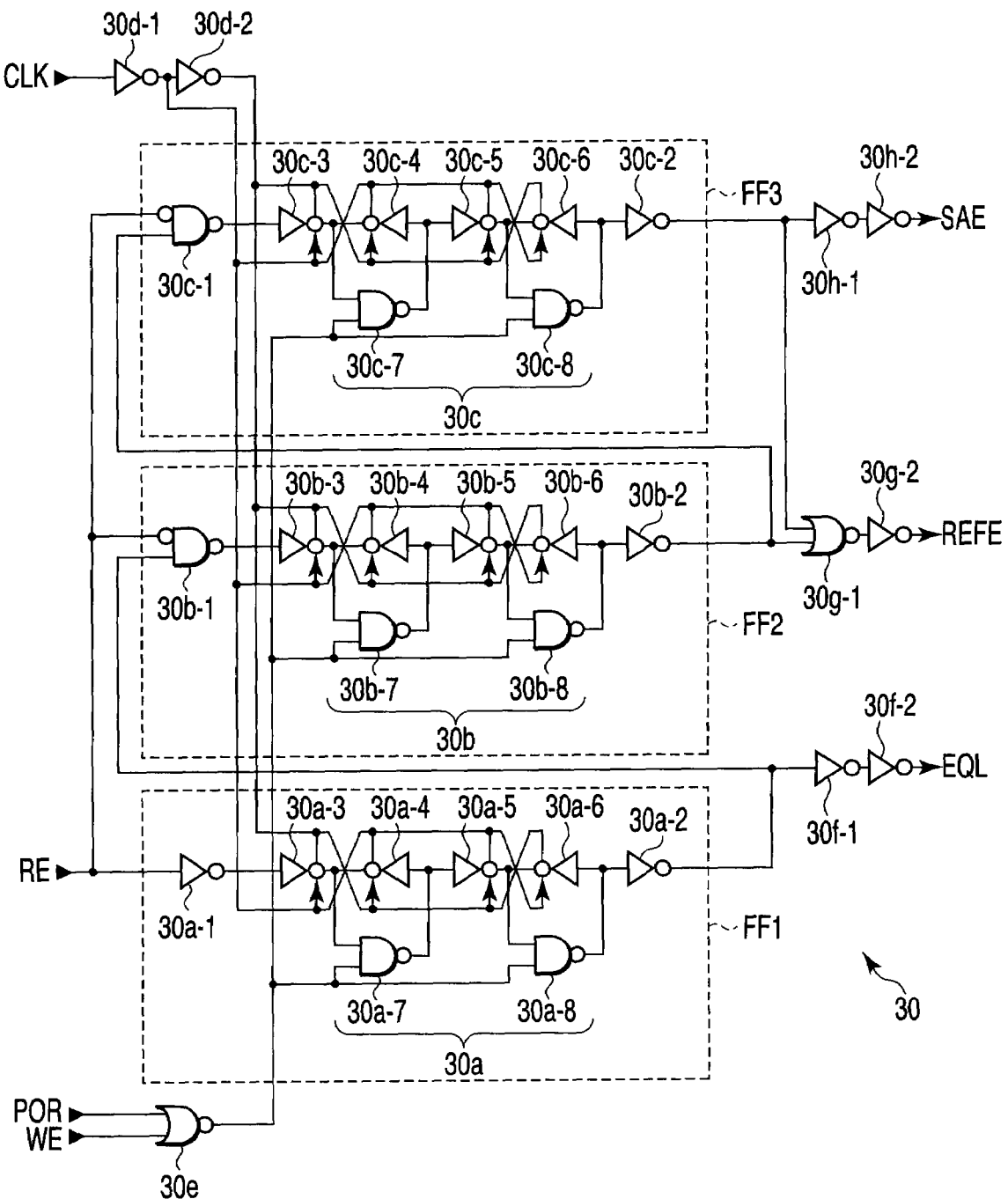
FIG. 2 is a circuit diagram showing a configuration of a read operation control sequential circuit in the memory shown in FIG. 1.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not satisfy the material, shape, structure or configuration of components of the present invention. Various changes and modifications can be made to the technical concept without departing from the scope of the claimed invention.

FIRST EMBODIMENT

FIG. 1 shows a basic configuration of a nonvolatile semiconductor memory device according to a first embodiment of the present invention. In order to describe the first embodiment, a one-time programmable memory using an irreversible gate-oxide-film destruction type anti-fuse storage element to which data (information) cannot be rewritten, is taken as one example. In this memory, the number of anti-fuse storage elements is one.

As shown in FIG. 1, an anti-fuse storage element 11, which is a nonvolatile storage element, is formed by a P-channel metal oxide semiconductor (MOS) transistor. One terminal (source and drain) of the storage element 11 is connected to a power supply VDD. The other terminal (gate) thereof, which serves as a storage node SN, is connected to the drain of the source and drain of an N-channel MOS transistor that serves as a write gate 13. The other terminal (gate) is also connected to the source of an N-channel MOS transistor that serves as an equalize gate 15 and a noninverting input terminal (+) of a differential amplifier 17.

The source of the write gate 13 is connected to a power supply of negative potential −VBP. The gate of the write gate 13 is connected to a write operation control combination circuit 20.

The drain of the equalize gate 15 is grounded (it is connected to a ground potential VSS). The gate of the equalize gate 15 is connected to a read operation control sequential circuit 30.

The inverting input terminal (−) of the differential amplifier 17 is supplied with a reference potential VREF from a reference potential generating power supply (not shown). The output terminal of the differential amplifier 17 is connected to an output buffer 19 that is formed by a flip-flop FF.

The output buffer 19 reads the output of the differential amplifier 17 out of the memory as output data D in synchronization with an external input clock CLK.

The write operation control combination circuit 20 controls a write operation according to the state of a write operation instruction signal WE for giving an instruction to start the write operation. The signal WE is input to the circuit 20 asynchronously with the external input clock CLK. The circuit 20 supplies the gate of the write gate 13 with a write control signal SL for controlling the write gate 13 at the time of write operation.

The read operation control sequential circuit 30 starts to perform a read operation upon receipt of a read operation instruction signal RE for giving an instruction to start the read operation and controls the timing of the read operation in synchronization with the external input clock CLK. The signal RE is input to the circuit 30 synchronously with the external input clock CLK. At the time of read operation, the circuit 30 supplies the gate of the equalize gate 15 with an equalize signal EQL to control the equalize gate 15. The circuit 30 also supplies the differential amplifier 17 with a differential amplifier control signal SAE to control the differential amplifier 17. The circuit 30 also supplies the reference potential generating power supply (not shown) with a reference potential control signal REFE to generate the reference potential VREF.

The read operation control sequential circuit 30 includes an asynchronous reset terminal (reset circuit). The asynchronous reset terminal (reset circuit) resets the read operation of the circuit 30 upon receipt of the write operation instruction signal WE. The configuration of the circuit 30 will be described in detail later.

The anti-fuse storage element 11 is in a high-resistance state before data (e.g., "1") is written thereto. Data is written to the storage element 11 by applying a high voltage to both terminals of the storage element 11, and then the storage element 11 is placed into a low-resistance state. More specifically, in write operation, the write gate 13 is activated by the output (write control signal SL) of the write operation control combination circuit 20. Then, a high voltage (e.g., 7 V) generated from a difference between a power supply voltage VDD (e.g., 1.5 V) and a power supply voltage of high negative potential −VBP (e.g., −5.5 V) is applied to both the terminals of the anti-fuse storage element 11. Thus, the gate oxide film of the storage element 11 is destroyed and, for example, data "1" is written thereto.

On the other hand, in read operation, the equalize gate 15 and differential amplifier 17 are activated by the output (equalize signal EQL, differential amplifier control signal SAE) of the read operation control sequential circuit 30. Thus, a power supply voltage VDD of, e.g., 1.5 V, which does not destroy the anti-fuse storage element 11, is applied to one of the terminals of the storage element 11. If a voltage that appears at the other terminal (storage node SN) is detected by the differential amplifier 17, data is read out (determined).

The data stored in the anti-fuse storage element 11 is saved even after the memory is powered off, and can be read out multiple times if the memory is powered on again. However, the data written once cannot be erased. As such a nonvolatile storage element, an anti-fuse storage element of a gate-oxide-film destruction type is well known, which destroys the gate oxide film of a MOS transistor by applying a high-voltage stress between the gate and each of the source and drain.

The above-described read operation for reading data from the anti-fuse storage element 11 will be described in more detail. First, the equalize gate 15 is activated in response to the equalize signal EQL output from the read operation control sequential circuit 30, which corresponds to the read operation instruction signal RE. Thus, the storage node SN is equalized to a ground potential VSS (e.g., 0 V) in advance. Then, the equalize gate 15 is returned to an inactive state, and the reference potential generating power supply (not shown) is activated to generate a reference potential VREF. After a time period elapses to stabilize the potential of the storage node SN, the differential amplifier 17 is activated by the differential amplifier control signal SAE output from the circuit 30. The activated differential amplifier 17 compares the potential of the storage node SN with the reference potential VREF. This comparison makes it possible to determine (detect) whether the gate oxide film of the anti-fuse storage element 11 is destroyed, or whether "1" is stored in the storage element 11 as data. After that, the output of the differential amplifier 17 is synchronized with the external input clock CLK and output from the memory through the output buffer 19 as output data D.

The output of the differential amplifier 17 can be output not but through the output buffer 19. In either case, however, the data (electrical signal) which is read out of the anti-fuse storage element 11 is very weak. The control timing of the equalize gate 15, reference potential VREF and differential amplifier 17 is important in reading data out of the element 11 correctly.

FIG. 2 shows an example of the configuration of the above-described read operation control sequential circuit 30. In the first embodiment, the circuit 30 includes three flip-flops FF1, FF2 and FF3. The flip-flops FF1, FF2 and FF3 have asynchronous reset terminals 30a, 30b and 30c, respectively. The asynchronous reset terminals 30a, 30b and 30c are so configured that they are controlled by the NOR output of a power-on reset signal POR and a write operation instruction signal WE. In other words, the first embodiment is directed to reset terminals of negative logic.

The flip-flop FF1 of the first stage (first flip-flop FF1) includes inverters (NOT circuits) 30a-1 and 30a-2, clocked inverters 30a-3, 30a-4, 30a-5 and 30a-6, and NAND circuits 30a-7 and 30a-8 that make up an asynchronous reset terminal 30a. The inverter 30a-1, clocked inverters 30a-3, 30a-4, 30a-5 and 30a-6, and inverter 30a-2 are connected in series. The output terminals of the clocked inverters 30a-3 and 30a-4 are connected to each other. The input terminals of the clocked inverters 30a-4 and 30a-5 are connected to each other. The output terminals of the clocked inverters 30a-5 and 30a-6 are connected to each other. One input terminal of the NAND circuit 30a-7 is connected to each of the output terminals (a mutual connecting node) of the clocked inverters 30a-3 and 30a-4. The output terminal of the NAND circuit 30a-7 is connected to each of the input terminals (a mutual connecting node) of the clocked inverters 30a-4 and 30a-5. One input terminal of the NAND circuit 30a-8 is connected to each of the output terminals (a mutual connecting node) of the clocked inverters 30a-5 and 30a-6. The output terminal of the NAND circuit 30a-8 is connected to each of the input terminals (a mutual connecting node) of the clocked inverters 30a-6 and inverter 30a-2. The inverter 30a-1 is provided in the input stage of the flip-flop FF1 and its input terminal is supplied with a read operation instruction signal RE.

The flip-flop FF2 of the second stage (second flip-flop FF2) includes a NAND circuit 30b-1, an inverter 30b-2, clocked inverters 30b-3, 30b-4, 30b-5 and 30b-6, and NAND circuits 30b-7 and 30-b8 that make up an asynchronous reset terminal 30b. The NAND circuit 30b-1, clocked inverters 30b-3, 30b-4, 30b-5 and 30b-6, and inverter 30b-2 are connected in series. The output terminals of the clocked inverters 30b-3 and 30b-4 are connected to each other. The input terminals of the clocked inverters 30b-4 and 30b-5 are connected to each other. The output terminals of the clocked inverters 30b-5 and 30b-6 are connected to each other. One input terminal of the NAND circuit 30b-7 is connected to each of the output terminals (a mutual connecting node) of the clocked inverters 30b-3 and 30b-4. The output terminal of the NAND circuit 30b-7 is connected to each of the input terminals (a mutual connecting node) of the clocked inverters 30b-4 and 30b-5. One input terminal of the NAND circuit 30b-8 is connected to each of the output terminals (a mutual connecting node) of the clocked inverters 30b-5 and 30b-6. The output terminal of the NAND circuit 30b-8 is connected to each of the input terminals (a mutual connecting node) of the clocked inverters 30b-6 and inverter 30b-2. The NAND circuit 30b-1 is provided in the input stage of the flip-flop FF2. One of the input terminals of the NAND circuit 30b-1 is an inverting input terminal that is supplied with a read operation instruction signal RE. The other input terminal (noninverting input terminal) of the NAND circuit 30b-1 is supplied with the output of the flip-flop FF1. In other words, the output terminal of the inverter 30a-2 provided in the output stage of the flip-flop FF1 is connected to the noninverting input terminal of the NAND circuit 30b-1.

The flip-flop FF3 of the final stage (third flip-flop FF3) includes a NAND circuit 30c-1, an inverter 30c-2, clocked inverters 30c-3, 30c-4, 30c-5 and 30c-6, and NAND circuits 30c-7 and 30c-8 that make up an asynchronous reset terminal 30c. The NAND circuit 30c-1, clocked inverters 30c-3, 30c-4, 30c-5 and 30c-6, and inverter 30c-2 are connected in series.

The output terminals of the clocked inverters 30*c*-3 and 30*c*-4 are connected to each other. The input terminals of the clocked inverters 30*c*-4 and 30*c*-5 are connected to each other. The output terminals of the clocked inverters 30*c*-5 and 30*c*-6 are connected to each other. One input terminal of the NAND circuit 30*c*-7 is connected to each of the output terminals (a mutual connecting node) of the clocked inverters 30*c*-3 and 30*c*-4. The output terminal of the NAND circuit 30*c*-7 is connected to each of the input terminals (a mutual connecting node) of the clocked inverters 30*c*-4 and 30*c*-5. One input terminal of the NAND circuit 30*c*-8 is connected to each of the output terminals (a mutual connecting node) of the clocked inverters 30*c*-5 and 30*c*-6. The output terminal of the NAND circuit 30*c*-8 is connected to each of the input terminals (a mutual connecting node) of the clocked inverter 30*c*-6 and inverter 30*c*-2. The NAND circuit 30*c*-1 is provided in the input stage of the flip-flop FF3. One input terminal of the NAND circuit 30*c*-1 is an inverting input terminal that is supplied with a read operation instruction signal RE. The other input terminal (noninverting input terminal) of the NAND circuit 30*c*-1 is supplied with the output of the flip-flop FF2. In other words, the output terminal of the inverter 30*b*-2 provided in the output stage of the flip-flop FF2 is connected to the noninverting input terminal of the NAND circuit 30*c*-1.

Inverters 30*d*-1 and 30*d*-2 are connected in series in a stage precedent to the input stage of the flip-flops FF1, FF2 and FF3. The flip-flops FF1, FF2 and FF3 are supplied with an external input clock CLK via the inverter 30*d*-1. The flip-flops FF1, FF2 and FF3 are also supplied with an external input clock CLK via the inverters 30*d*-1 and 30*d*-2. In other words, the external input clock CLK is inverted once and supplied to one control terminal of each of the clocked inverters 30*a*-3 and 30*a*-4 and one control terminal of each of the clocked inverters 30*a*-5 and 30*a*-6. The external input clock CLK is also inverted once and supplied to one control terminal of each of the clocked inverters 30*b*-3 and 30*b*-4 and one control terminal of each of the clocked inverters 30*b*-5 and 30*b*-6. The external input clock CLK is also inverted once and supplied to one control terminal of each of the clocked inverters 30*c*-3 and 30*c*-4 and one control terminal of each of the clocked inverters 30*c*-5 and 30*c*-6. The external input clock CLK is inverted twice and supplied to the other control terminal of each of the clocked inverters 30*a*-3 and 30*a*-4 and the other control terminal of each of the clocked inverters 30*a*-5 and 30*a*-6. The external input clock CLK is also inverted twice and supplied to the other control terminal of each of the clocked inverters 30*b*-3 and 30*b*-4 and the other control terminal of each of the clocked inverters 30*b*-5 and 30*b*-6. The external input clock CLK is also inverted twice and supplied to the other control terminal of each of the clocked inverters 30*c*-3 and 30*c*-4 and the other control terminal of each of the clocked inverters 30*c*-5 and 30*c*-6.

A NOR circuit 30*e* is provided in a stage precedent to the input stage of the flip-flops FF1, FF2 and FF3. One input terminal of the NOR circuit 30*e* is supplied with a write operation instruction signal WE, and the other input terminal thereof is supplied with a power-on reset signal POR. The output terminal of the NOR circuit 30*e* is connected to the asynchronous reset terminals 30*a*, 30*b* and 30*c* of the flip-flops FF1, FF2 and FF3. In other words, the output terminal of the NOR circuit 30*e* is connected to the other input terminal of each of the NAND circuits 30*a*-7 and 30*a*-8 of the flip-flop FF1. The output terminal of the NOR circuit 30*e* is also connected to the other input terminal of each of the NAND circuits 30*b*-7 and 30*b*-8 of the flip-flop FF2. The output terminal of the NOR circuit 30*e* is also connected to the other input terminal of each of the NAND circuits 30*c*-7 and 30*c*-8 of the flip-flop FF3.

On the other hand, inverters 30*f*-1 and 30*f*-2 are connected in series in a stage subsequent to the output stage of the flip-flop FF1. The output of the inverter 30*a*-2, which is the output of the flip-flop FF1, is taken as the equalize signal EQL through the inverters 30*f*-1 and 30*f*-2.

A NOR circuit 30*g*-1 and an inverter 30*g*-2 are connected in series in a stage subsequent to the output stage of the flip-flop FF2. One input terminal of the NOR circuit 30*g*-1 is supplied with the output of the inverter 30*b*-2, which is the output of the flip-flop FF2, and the other input terminal thereof is supplied with the output of the inverter 30*c*-2, which is the output of the flip-flop FF3. Thus, the above reference potential control signal REFE is taken out of the output terminal of the inverter 30*g*-2 to generate a reference potential VREF from the reference potential generating power supply (not shown).

Inverters 30*h*-1 and 30*h*-2 are connected in series in a stage subsequent to the output stage of the flip-flop FF3. The output of the inverter 30*c*-2, which is the output of the flip-flop FF3, is taken as the above differential amplifier control signal SAE through the inverters 30*h*-1 and 30*h*-2.

Figure 3:
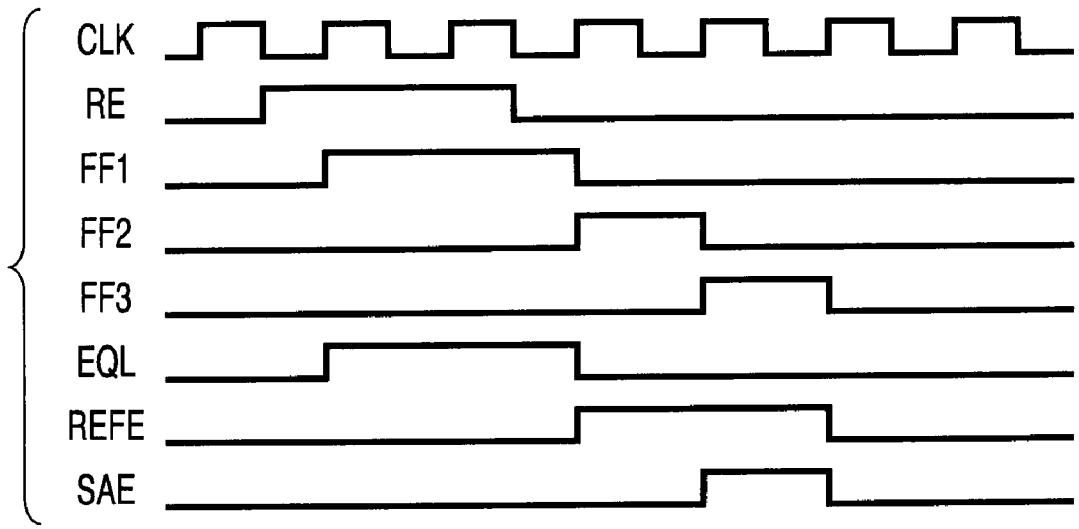
FIG. 3 is a timing chart illustrating the operation of the read operation control sequential circuit shown in FIG. 2.

FIG. 3 illustrates a basic read operation of the read operation control sequential circuit 30 described above. The first flip-flop FF1 shown in FIG. 2 captures a read operation instruction signal RE at the rise of the external input clock CLK and activates an equalize signal EQL that controls the equalize gate 15. The flip-flop FF1 returns the equalize signal EQL to an inactive state at the timing after the next timing of the external input clock CLK. Simultaneously with this, the second flip-flop FF2 activates a reference potential control signal REFE to control the generation of a reference potential VREF. The final flip-flop FF3 activates a differential amplifier control signal SAE, which controls the differential amplifier 17, at the next rise of the external input clock CLK. Both the differential amplifier control signal SAE and reference potential control signal REFE are returned to an inactive state at the next timing of the external input clock CLK.

Various configurations can be considered as the read operation control sequential circuit 30 shown in FIG. 2. In order to control the timing of a series of read operations, generally, it is desirable to use a sequential circuit. In the first embodiment, three flip-flops FF1, FF2 and FF3 are adopted to configure the sequential circuit. The flip-flops FF1, FF2 and FF3 include asynchronous reset terminals 30*a* (30*a*-7, 30*a*-8), 30*b* (30*b*-7, 30*b*-8) and 30*c* (30*c*-7, 30*c*-8), respectively. The asynchronous reset terminals 30*a*, 30*b* and 30*c* are supplied with a NOR output (30*e*) of the write operation instruction signal WE and power-on reset signal POR. The power-on reset signal POR is activated while power is turned on or immediately after it is done to reset the sequential circuit (flip-flops FF1, FF2 and FF3) in the initial state.

In the first embodiment, when the memory performs a normal write operation, it is supplied with a write operation instruction signal WE before a read operation is carried out after power is turned on or when the memory is in a standby state after the read operation is completed. In this case, the read operation control sequential circuit 30 is in a standby state, and this standby state does not inhibit the write operation. However, a normal write operation is not assured in general when a write operation instruction signal WE is input at unexpected timing, or when it is input erroneously during the read operation. Furthermore, it is likely that an unusually large stress will be applied to the elements that make up the circuit (memory) to destroy the elements. More specifically, it is assumed that the write gate 13 is activated while the equalize gate 15 is being activated. Then, a desired high voltage of, e.g., 7 V is not applied to the anti-fuse storage element 11, but data is written incorrectly. A potential (5.5 V) in difference between a power supply voltage of great negative potential −VBP (e.g., −5.5 V) and a ground potential VSS (e.g., 0 V) is applied to the write gate 13 and equalize gate 15. It is therefore likely that the equalize gate 15 will be destroyed by a large current to be generated due to the application of the potential (5.5 V).

According to the first embodiment, the flip-flops FF1, FF2 and FF3 of the sequential circuit include asynchronous reset terminals 30a, 30b and 30c in order to prevent the elements of the circuit (memory) from being destroyed by the write operation instruction signal WE that is input at unexpected timing. The reset terminals 30a, 30b and 30c of the negative logic are supplied with a result of NOR logic (NOR output) of the power-on reset signal POR and write operation instruction signal WE. Even though the write operation instruction signal WE is input erroneously during the read operation, the read operation can be stopped immediately to avoid the risk of destroying the elements.

It is desirable that the power-on reset signal POR be present in order to determine the state of a power supply after power is turned on; however, this is not indispensable to the first embodiment.

Figure 4:
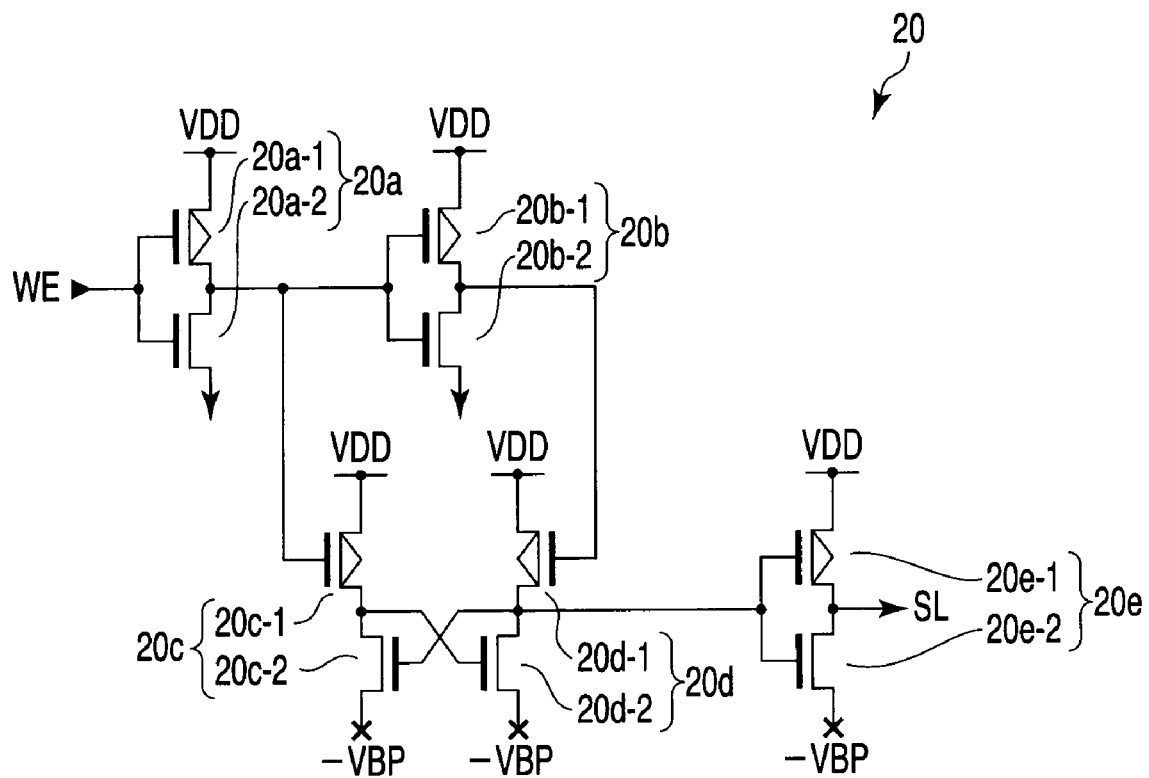
FIG. 4 is a circuit diagram showing a configuration of a write operation control combination circuit in the memory shown in FIG. 1.

FIG. 4 shows an example of the configuration of the write operation control combination circuit 20 described above. The circuit shown in FIG. 4 has the simplest configuration and includes five CMOS inverters 20a, 20b, 20c, 20d and 20e each having a complementary MOS (CMOS) structure.

The CMOS inverter 20a includes a P-channel MOS transistor 20a-1 and an N-channel MOS transistor 20a-2. The CMOS inverter 20b includes a P-channel MOS transistor 20b-1 and an N-channel MOS transistor 20b-2. The CMOS inverter 20c includes a P-channel MOS transistor 20c-1 and an N-channel MOS transistor 20c-2. The CMOS inverter 20d includes a P-channel MOS transistor 20d-1 and an N-channel MOS transistor 20d-2. The CMOS inverter 20e includes P-channel MOS transistors 20e-1 and 20e-2. The gates (a mutual connecting node) of the transistors 20a-1 and 20a-2 are supplied with a write operation instruction signal WE. The gates (a mutual connecting node) of the transistors 20b-1 and 20b-2 are connected to the drains (a mutual connecting node) of the P-channel and N-channel MOS transistors 20a-1 and 20a-2. The gate of the P-channel MOS transistor 20c-1 is connected to the drains of the P-channel and N-channel MOS transistors 20a-1 and 20a-2. The gate of the P-channel MOS transistor 20d-1 is connected to the drains (a mutual connecting node) of the P-channel and N-channel MOS transistors 20b-1 and 20b-2. The gate of the N-channel MOS transistor 20d-2 is connected to the drains (a mutual connecting node) of the P-channel and N-channel MOS transistors 20c-1 and 20c-2. The gate of the N-channel MOS transistor 20c-2 is connected to the drains (a mutual connecting node) of the P-channel and N-channel MOS transistors 20d-1 and 20d-2. The gates (a mutual connecting node) of the P-channel and N-channel MOS transistors 20e-1 and 20e-2 are connected to the drains of the P-channel and N-channel MOS transistors 20d-1 and 20d-2. The above write control signal SL is taken out of the drains (mutual connecting node) of the transistors 20e-1 and 20e-2.

The sources of the P-channel MOS transistors 20a-1, 20b-1, 20c-1, 20d-1 and 20e-1 of the CMOS inverters 20a, 20b, 20c, 20d and 20e are connected to their respective power supplies VDD. The sources of the N-channel MOS transistors 20a-2 and 20b-2 of the CMOS inverters 20a and 20b are grounded (ground potentials VSS). The sources of the N-channel MOS transistors 20c-2, 20d-2 and 20e-2 of the CMOS inverters 20c, 20d and 20e are connected to the power supply of negative potential −VBP.

The write operation control combination circuit 20 is a so-called combination logic circuit that outputs a write control signal SL in response to a write operation instruction signal WE. The first embodiment is directed to a negative level shifter which outputs a write control signal SL upon receipt of a write operation instruction signal WE. The write control signal SL is set at a power supply voltage VDD (for example, 1.5 V) in a write operation state and a negative power supply voltage −VBP (for example, −5.5 V) in the other state. The write operation instruction signal WE is set at a power supply voltage VDD (for example, 1.5 V) in a write operation state and a ground voltage VSS (for example 0 V) in the other state. It is therefore preferable that the circuit 20 be configured by a very simple combination logic circuit in order to prevent a malfunction.

The operation of the memory shown in FIG. 1, which is performed when the memory is supplied with a write operation instruction signal WE at unexpected timing, will be described briefly. Assume now that the memory receives a read operation instruction signal RE. Then, the read operation control sequential circuit 30 activates the equalize signal EQL, reference potential control signal REFE and differential amplifier control signal SAE in sequence to perform a read operation.

Assume that the write operation control combination circuit 20 receives a write operation instruction signal WE in the above state. Then, the circuit 20 outputs a write control signal SL of VDD (e.g., 1.5 V) to activate the write gate 13.

Simultaneously with this, the result of NOR logic obtained in accordance with the input of the write operation instruction signal WE is sent to the asynchronous reset terminals 30a, 30b and 30c. Then, the read operation control sequential circuit 30 inactivates the equalize signal EQL, reference potential control signal REFE and differential amplifier control signal SAE at once to stop the read operation. The memory can thus prevent the elements such as the equalize gate 15 from being destroyed even when it receives a write operation instruction signal WE at unexpected timing.

As described above, the write operation control combination circuit 20 that is supplied with a write operation instruction signal WE is configured by a simple combination logic circuit. In contrast, the read operation control sequential circuit 30 that is supplied with a read operation instruction signal RE has a relatively complicated configuration including a sequential circuit, and includes asynchronous reset terminals 30a, 30b and 30c that are supplied with the write operation instruction signal WE. Even though the memory receives a write operation instruction signal WE at unexpected timing, its read operation can be stopped at once (read stall). Consequently, the elements of the circuit can be prevented from being destroyed and accordingly a reliable write operation can be performed.

According to the first embodiment, when the memory is sealed with a package or mounted on a board, a write operation instruction signal WE can be supplied directly to the ground potential VSS (e.g., 0 V) to reduce the risk of erroneous writing greatly. In other words, data can be prevented from being lost by erroneous writing even when power is suddenly stopped (instantaneous power failure) or a soft error is caused in the internal node by the influence of radiation.

SECOND EMBODIMENT

Figure 5:
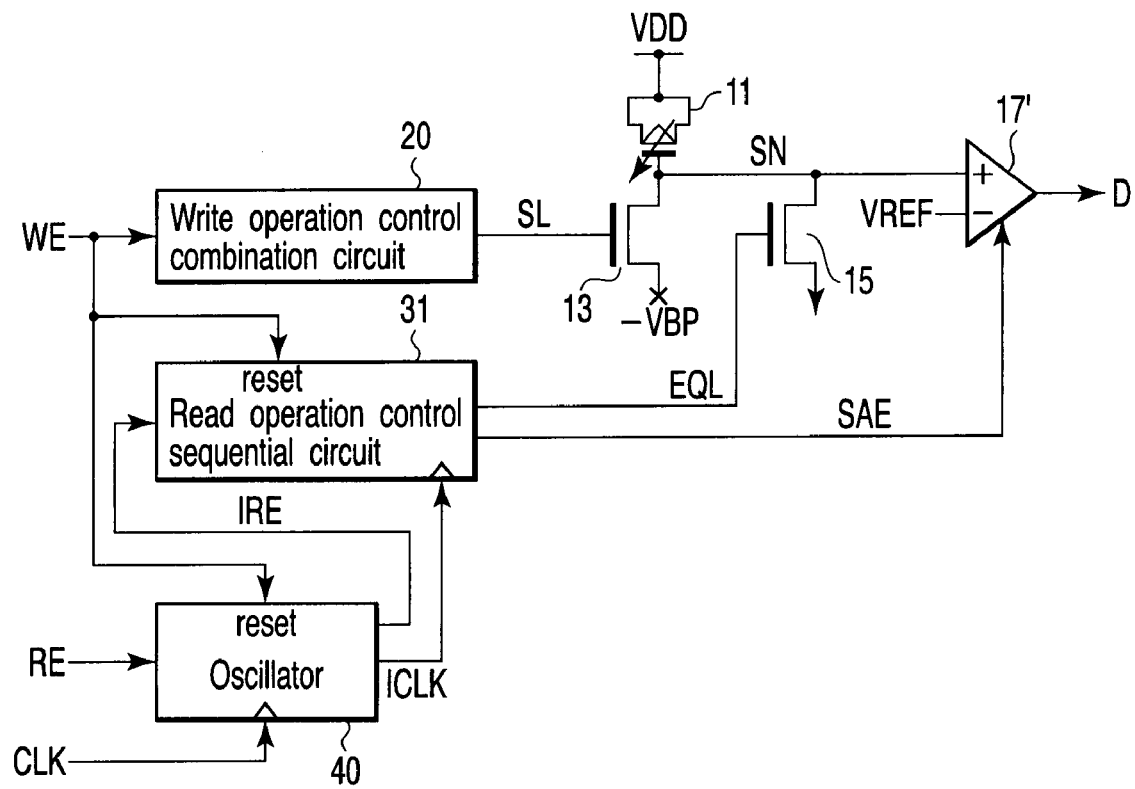
FIG. 5 is a circuit diagram showing a configuration of a nonvolatile semiconductor memory device (one-time programmable memory) according to a second embodiment of the present invention.

FIG. 5 shows a basic configuration of a nonvolatile semiconductor memory device according to a second embodiment of the present invention. The second embodiment is directed to a one-time programmable memory using an anti-fuse storage element of an irreversible gate-oxide-film destruction type, to which data (information) cannot be rewritten. In this memory, the number of anti-fuse storage elements is one. The second embodiment is equivalent to the memory of the first embodiment which is configured without using any output buffers. Each component common to FIGS. 1 and 5 is denoted by the same reference numeral and its detailed description is omitted.

Referring to FIG. 5, the memory of the second embodiment includes an anti-fuse storage element 11, a write gate 13, an equalize gate 15, a differential amplifier 17', a write operation control combination circuit 20, a read operation control sequential circuit 31 having an asynchronous reset terminal (reset circuit), and an oscillator 40. The oscillator 40 is supplied with a read operation instruction signal RE synchronously with an external input clock CLK. The signal RE gives an instruction to start a read operation. In response to the signal RE, the oscillator 40 generates an internal clock ICLK. In synchronization with the internal clock ICLK, the oscillator 40 supplies the circuit 31 with an internal read operation instruction signal IRE that controls the read operation. The oscillator 40 has an asynchronous reset terminal that is supplied with a write operation instruction signal WE asynchronously with the external input clock CLK. The signal WE gives an instruction to start a write operation.

According to the second embodiment, the read operation control sequential circuit 31 receives the internal read operation instruction signal IRE to start a read operation. The circuit 31 controls the timing of the read operation in synchronization with the internal clock ICLK. In the second embodiment, the output of the differential amplifier 17' is read out of the memory as output data D. This configuration differs from that of the first embodiment because the read operation control sequential circuit differs from that of the first embodiment. In the second embodiment, too, however, the control timing of the equalize gate 15, reference potential VREF and differential amplifier 17' is important in reading weak data (electrical signal) out of the anti-fuse storage memory 11.

Figure 6:
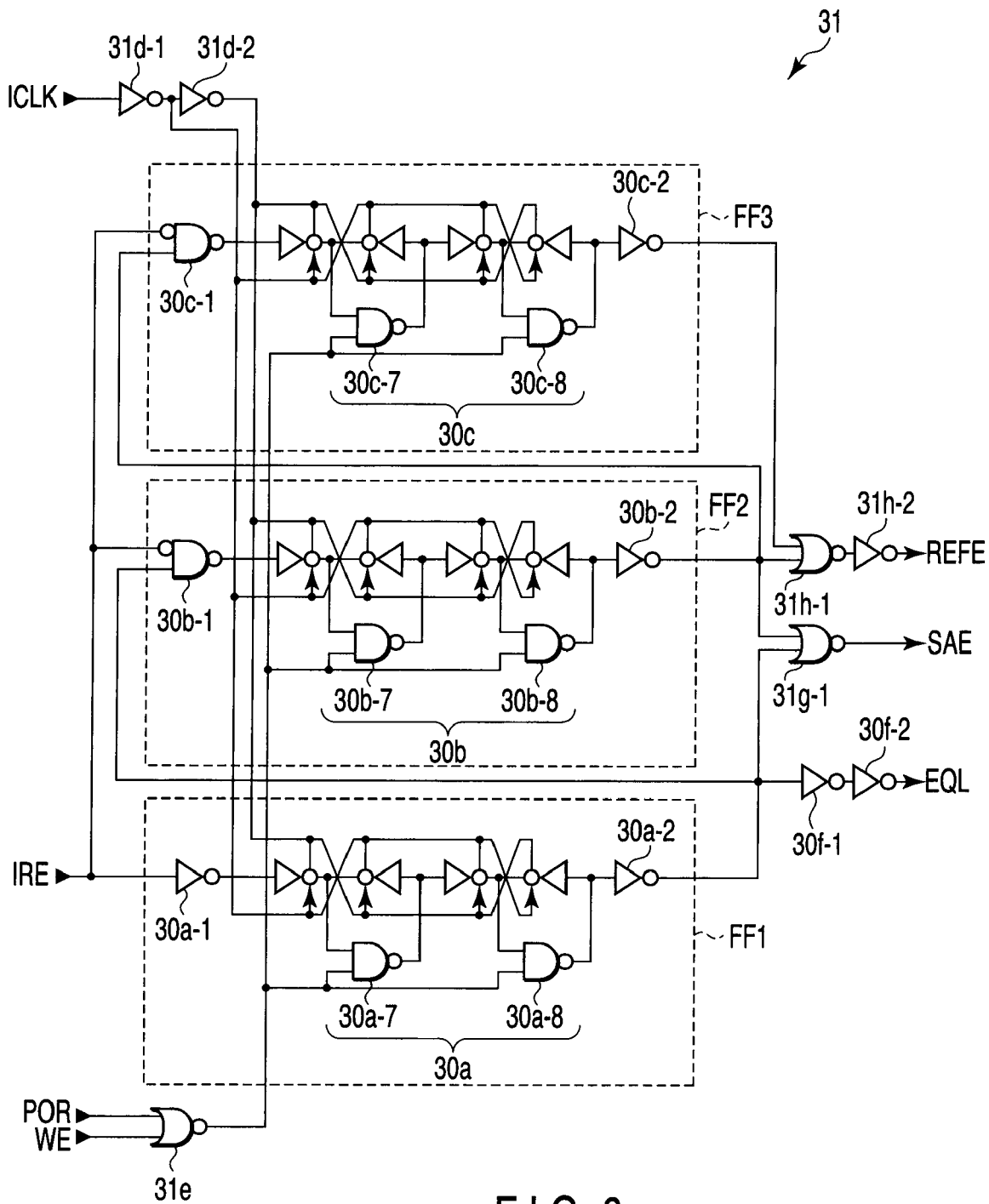
FIG. 6 is a circuit diagram showing a configuration of a read operation control sequential circuit in the memory shown in FIG. 5.

FIG. 6 shows an example of the configuration of the read operation control sequential circuit 31 described above. In the second embodiment, the asynchronous reset terminal of the circuit 31 is configured by the NOR output of a power-on reset signal POR and a write operation instruction signal WE. Each component common to the circuit 31 and the circuit 30 of the first embodiment is denoted by the same reference numeral and its detailed description is omitted.

Referring to FIG. 6, the read operation control sequential circuit 31 includes three flip-flops FF1, FF2 and FF3. The flip-flops FF1, FF2 and FF3 each receive an internal read operation instruction signal IRE from the oscillator 40. The flip-flops FF1, FF2 and FF3 each receive an internal clock ICLK from the oscillator 40 through an inverter 31d-1. The flip-flops FF1, FF2 and FF3 each receive an internal clock ICLK from the oscillator 40 through both inverters 31d-1 and 31d-2. The flip-flops FF1, FF2, and FF3 include asynchronous reset terminals 30a (NAND circuits 30a-7 and 30a-8), 30b (NAND circuits 30b-7 and 30b-8), and 30c (NAND circuits 30c-7 and 30c-8), respectively. The asynchronous reset terminals 30a, 30b, and 30c are supplied with the output of a NOR circuit 31e, or the result of NOR logic between the power-on reset signal POR and write operation instruction signal WE.

Inverters 30f-1 and 30f-2 are connected in series in a stage subsequent to the output stage of the flip-flop FF1. The output of the inverter 30a-2, which corresponds to the output of the flip-flop FF1, is taken out as the equalize signal EQL through the inverters 30f-1 and 30f-2.

A NOR circuit 31g-1 is provided in a stage subsequent to the output stage of the flip-flop FF2. One input terminal of the NOR circuit 31g-1 is supplied with the output of the inverter 30b-2, which corresponds to the output of the flip-flop FF2, and the other input terminal thereof is supplied with the output of the inverter 30a-2 which corresponds to the output of the flip-flop FF1. The above differential amplifier control signal SAE is therefore taken out of the output terminal of the NOR circuit 31g-1.

A NOR circuit 31h-1 and an inverter 31h-2 are connected in series in a stage subsequent to the output stage of the flip-flop FF3. One input terminal of the NOR circuit 31h-1 is supplied with the output of the inverter 30c-2, which corresponds to the output of the flip-flop FF3, and the other input terminal thereof is supplied with the output of the inverter 30b-2, which corresponds to the output of the flip-flop FF2. Thus, the reference potential control signal REFE is taken out of the output terminal of the inverter 31h-2 to generate a reference potential VREF from the reference potential generating power supply (not shown).

Figure 7:
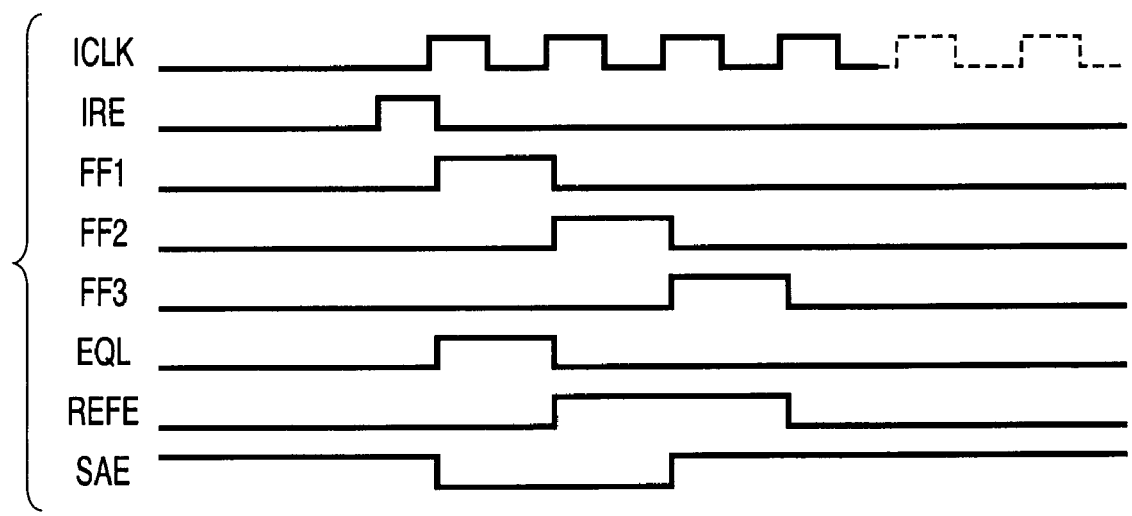
FIG. 7 is a timing chart illustrating the operation of the read operation control sequential circuit shown in FIG. 6.

FIG. 7 illustrates a basic read operation of the read operation control sequential circuit 31 described above. The flip-flop FF1 of the first stage shown in FIG. 6 captures an internal read operation instruction signal IRE at the rise of the internal clock ICLK and activates an equalize signal EQL that controls the equalize gate 15. Simultaneously, the flip-flop FF1 inactivates a differential amplifier control signal SAE to control the differential amplifier 17'. The flip-flop FF1 returns the equalize signal EQL to an inactive state at the next rise of the internal clock ICLK. Simultaneously, the flip-flop FF2 of the second stage activates a reference potential control signal REFE to control the generation of a reference potential VREF. The flip-flops FF1 and FF2 activate the differential amplifier control signal SAE at the next rise of the internal clock ICLK. The reference potential control signal REFE is returned to an inactive state at the next rise of the internal clock ICLK.

Various configurations can be considered for the read operation control sequential circuit 31 shown in FIG. 6. The feature of the configuration of the second embodiment lies in the following. The flip-flops FF1, FF2 and FF3 of the sequential circuit 31 include asynchronous reset terminals 30a, 30b and 30c, respectively, and the asynchronous reset terminals 30a, 30b and 30c are supplied with a result of NOR logic (NOR output) of the write operation instruction signal WE and power-on reset signal POR. This feature brings the same advantages as those of the first embodiment described above.

Assume that a write operation instruction signal WE is input at unexpected timing such as during read operation. Then, the output of the NOR circuit 31e is supplied to the asynchronous reset terminals 30a, 30b and 30c of the flip-flops FF1, FF2 and FF3. The read operation control sequential circuit 31 places the equalize signal EQL, differential amplifier control signal SAE and reference potential control signal REFE in the initial state at once. Even though the write operation instruction signal WE is input during the read operation, the read operation can be stopped immediately to avoid the risk of destroying the elements of the circuit.

Figure 8:
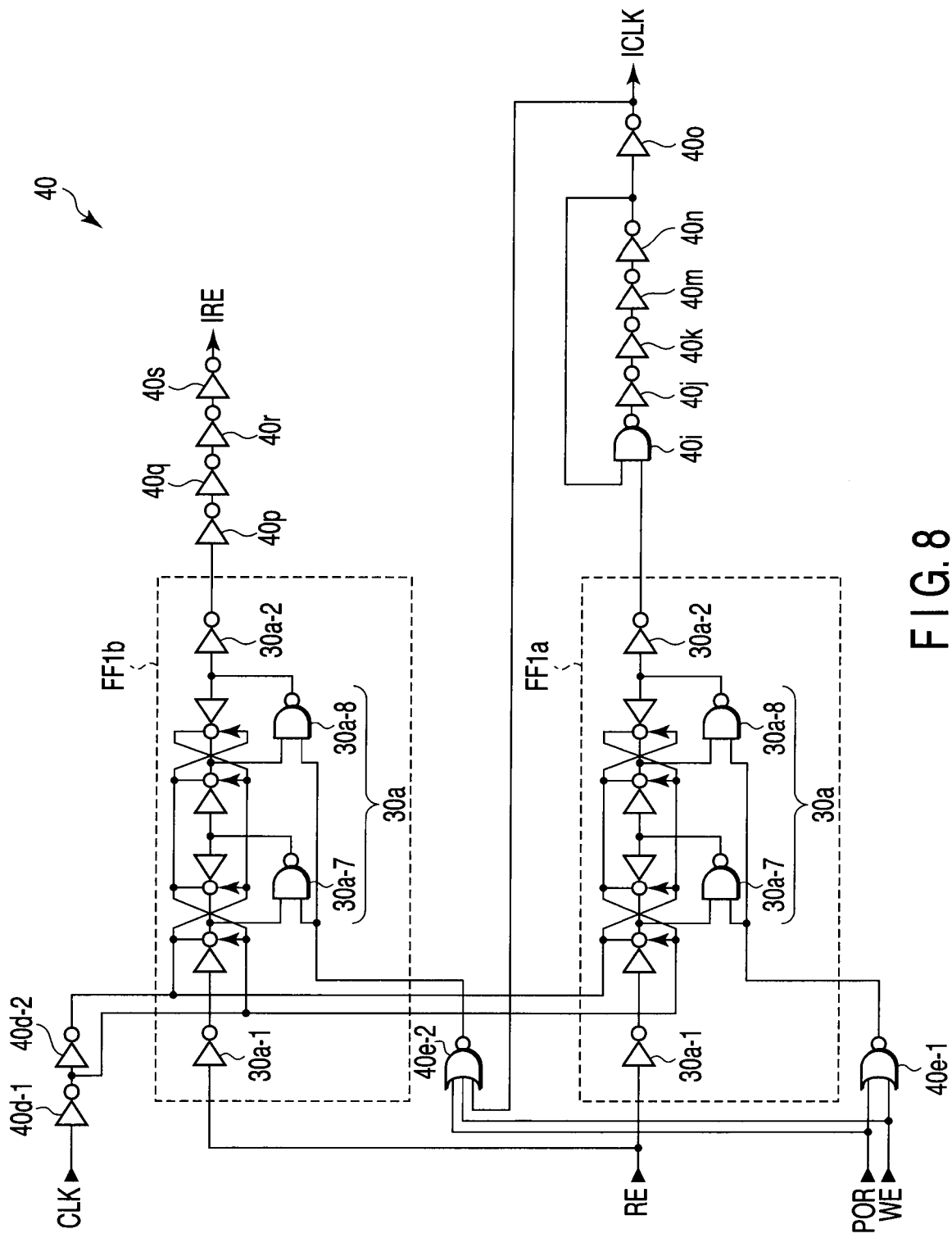
FIG. 8 is a circuit diagram showing a configuration of an oscillator in the memory shown in FIG. 5.

FIG. 8 shows an example of the configuration of the oscillator 40 described above. In the second embodiment, the asynchronous reset terminal of the oscillator 40 is configured at least by the NOR output of the power-on reset signal POR and write operation instruction signal WE. Referring to FIG. 8, the oscillator 40 includes two flip-flops FF1a and FF1b, and the flip-flops FF1a and FF1b each include an asynchronous reset terminal 30a (NAND circuits 30a-7 and 30a-8). In the second embodiment, the flip-flops FF1a and FF1b each have the same configuration as that of the flip-flop FF1 shown in FIG. 2.

The flip-flops FF1a and FF1b each receive a read operation instruction signal RE. They also receive an external input clock CLK through an inverter 40d-1. They also receive an external input clock CLK through both inverters 40d-1 and 40d-2.

A NAND circuit 40i and inverters 40j, 40k, 40m, 40n and 40o are connected in series in a stage subsequent to the output stage of the flip-flop FF1a in order to perform an oscillating operation. The output terminal of the inverter 30a-2, which is provided in the output stage of the flip-flop FF1a, is connected to one input terminal of the NAND circuit 40i. The output of the inverter 40n is connected to the other input terminal of the NAND circuit 40i. The internal clock ICLK is therefore taken out of the output terminal of the inverter 40o.

Inverters 40p, 40q, 40r and 40s are connected in series in a stage subsequent to the output stage of the flip-flop FF1b. Thus, the output of the inverter 30a-2, which is provided in the output stage of the flip-flop FF1b, is taken out of the output terminal of the inverter 40s as the internal read operation instruction signal IRE.

The asynchronous reset terminal 30a (NAND circuits 30a-7 and 30a-8) of the flip-flop FF1a is supplied with the output of a NOR circuit 40e-1, or the result of NOR logic of the power-on reset signal POR and write operation instruction signal WE. The asynchronous reset terminal 30a (NAND circuits 30a-7 and 30a-8) of the flip-flop FF1b is supplied with the output of a NOR circuit 40e-2, or the result of NOR logic of the power-on reset signal POR, the write operation instruction signal WE, and the output (internal clock ICLK) of the inverter 40o.

Figure 9:
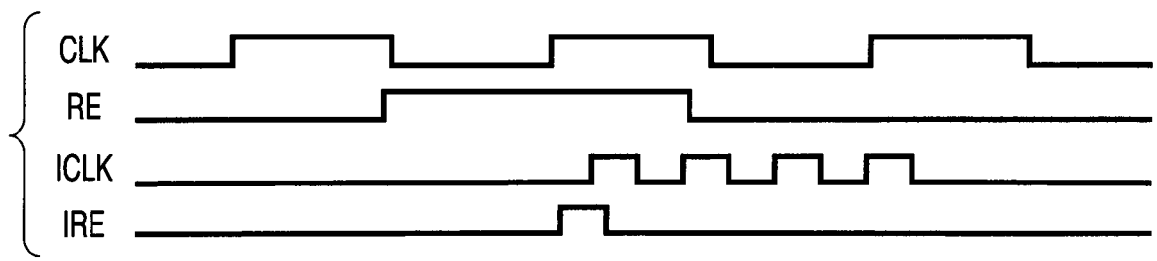
FIG. 9 is a timing chart explaining the operation of the oscillator shown in FIG. 8.

FIG. 9 illustrates a basic operation of the oscillator 40 described above. The oscillator 40 detects that the read operation instruction signal RE is set at the power supply voltage VDD (e.g., 1.5 V) at the rise of the external input clock CLK. Then, the oscillator 40 generates an internal read operation instruction signal IRE and supplies it to the read operation control sequential circuit 31. At the same time, the oscillator 40 starts an oscillating operation to generate an internal clock ICLK and supply it to the circuit 31. The signal IRE is reset at the first rise of the internal clock ICLK. The oscillator 40 stops the oscillating operation if it detects at the next rise of the external input clock CLK that the read operation instruction signal RE has been set at the ground potential VSS (e.g., 0 V). Then, the internal clock ICLK is dropped to the ground potential VSS. In order to complete the read operation, the internal clock ICLK needs to be output four or more times.

Figure 10:
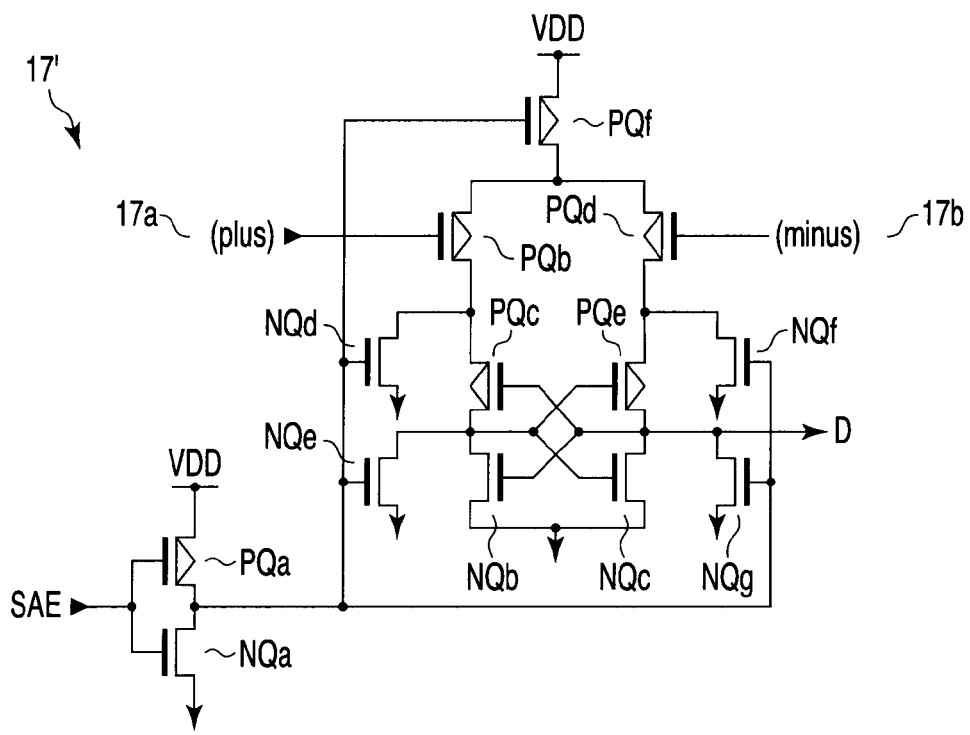
FIG. 10 is a circuit diagram showing a configuration of a differential amplifier shown in FIG. 5.

FIG. 10 shows an example of the configuration of the differential amplifier 17' described above. In the second embodiment, the differential amplifier 17' includes a dynamic load. More specifically, as shown in FIG. 10, the differential amplifier 17' includes six P-channel MOS transistors PQa, PQb, PQc, PQd, PQe and PQf and seven N-channel MOS transistors NQa, NQb, NQc, NQd, NQe, NQf and NQg. In the second embodiment, the differential amplifier 17' detects a difference in potential between a noninverting input terminal (plus) 17a and an inverting input terminal (minus) 17b at the timing when the differential amplifier control signal SAE changes from the ground potential VSS (e.g., 0 V) to the power supply voltage VDD (e.g., 1.5 V). If the inverting input terminal 17b to which the reference potential VREF is applied has a higher potential, the output data D is set at the ground potential VSS (e.g., 0 V). Conversely, if the noninverting input terminal 17a to which the potential of the storage node SN is applied has a higher potential, the output data D is set at the power supply voltage VDD (e.g., 1.5 V).

The dynamic load includes N-channel MOS transistors NQb and NQc connected to each other and P-channel MOS transistors PQc and PQe, and has a function of holding its own state. While the differential amplifier control signal SAE is held at the power supply voltage VDD (e.g., 1.5 V), the dynamic load continues to hold its output state (potential of output data D).

The operation of the memory shown in FIG. 5, which is carried out when the memory is supplied with a write operation instruction signal WE at unexpected timing, will be described in brief. Assume here that the read operation control sequential circuit 31 receives an internal read operation instruction signal IRE from the oscillator 40. The circuit 31 activates an equalize signal EQL, a reference potential control signal REFE and a differential amplifier control signal SAE in sequence at the up edge of a clock signal ICLK. If the signal WE is input to the write operation control combination circuit 20 in this state, the circuit 20 outputs a write control signal SL of VDD (e.g., 1.5 V) to activate the write gate 13 (see FIG. 4).

Simultaneously, the result of NOR logic obtained by the input of the write operation instruction signal WE is supplied to the asynchronous reset terminals 30a, 30b and 30c of the read operation control sequential circuit 31 and the asynchronous reset terminals 30a of the oscillator 40. Then, the oscillator 40 resets the internal read operation instruction signal IRE at once and drops the internal clock ICLK to the ground potential VSS (e.g., 0 V). The read operation control sequential circuit 31 initializes the equalize signal EQL, reference potential control signal REFE and differential amplifier control signal SAE at once to stop the read operation. The memory can thus prevent the elements such as the equalize gate 15 from being destroyed even if it receives the write operation instruction signal WE at unexpected timing.

As described above, the second embodiment can bring about the same advantages as those of the first embodiment. The write operation control combination circuit 20 that is supplied with a write operation instruction signal WE is configured by a simple combination logic circuit. In contrast, the read operation control sequential circuit 30 that is supplied with an internal read operation instruction signal RE and an internal clock ICLK has a relatively complicated configuration including a sequential circuit and includes asynchronous reset terminals 30a, 30b and 30c that are supplied with the write operation instruction signal WE. The oscillator 40 is provided to generate an internal read operation instruction signal IRE corresponding to the read operation instruction signal RE and an internal clock ICLK corresponding to the external input clock CLK, and includes asynchronous terminals 30a that are supplied with the signal WE. Even though the memory is supplied with a write operation instruction signal WE at unexpected timing, its read operation can be stopped more reliably. Consequently, the elements of the circuits can be prevented from being destroyed to perform a write operation with reliability.

In the second embodiment, too, when the memory is sealed with a package or mounted on a board, a write operation instruction signal WE can be supplied directly to the ground potential VSS (e.g., 0 V) to reduce the risk of erroneous writing greatly. In other words, data can be prevented from being lost by erroneous writing even though power is suddenly stopped (instantaneous power failure) or a soft error is caused in the internal node by the influence of radiation.

THIRD EMBODIMENT

Figure 11:
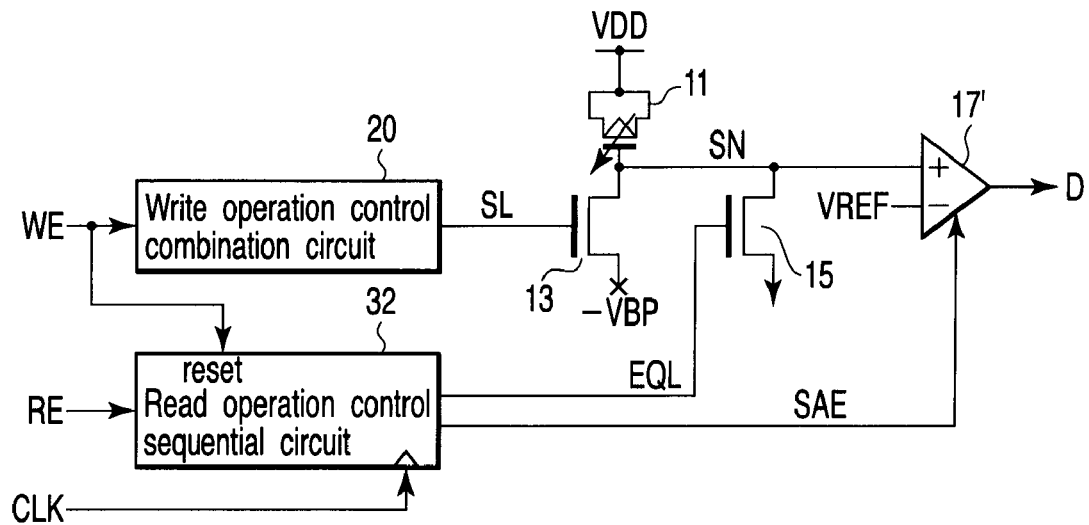
FIG. 11 is a circuit diagram showing a configuration of a nonvolatile semiconductor memory device (one-time programmable memory) according to a third embodiment of the present invention.

FIG. 11 shows a basic configuration of a nonvolatile semiconductor memory device according to a third embodiment of the present invention. The third embodiment is directed to a one-time programmable memory using an anti-fuse storage element of an irreversible gate-oxide-film destruction type, to which data (information) cannot be rewritten. In this memory, the number of anti-fuse storage elements is one. The third embodiment is equivalent to the memory of the second embodiment which is configured without using any oscillator. Each component common to FIGS. 5 and 11 is denoted by the same reference numeral and its detailed description is omitted.

Referring to FIG. 11, the memory of the third embodiment includes an anti-fuse storage element 11, a write gate 13, an equalize gate 15, a differential amplifier 17', a write operation control combination circuit 20, and a read operation control sequential circuit 32 having an asynchronous reset terminal (reset circuit). In the third embodiment, since the read operation control sequential circuit is modified further and the differential amplifier includes a dynamic load (see FIG. 10), the memory does not require any oscillator. For example, the circuit 32 is configured to start the operation of one or more delay circuits in response to a read operation instruction signal RE for giving an instruction to start a read operation in synchronization with the external input clock CLK and to control the read operation in accordance with the output timing of the delay circuits.

Figure 12:
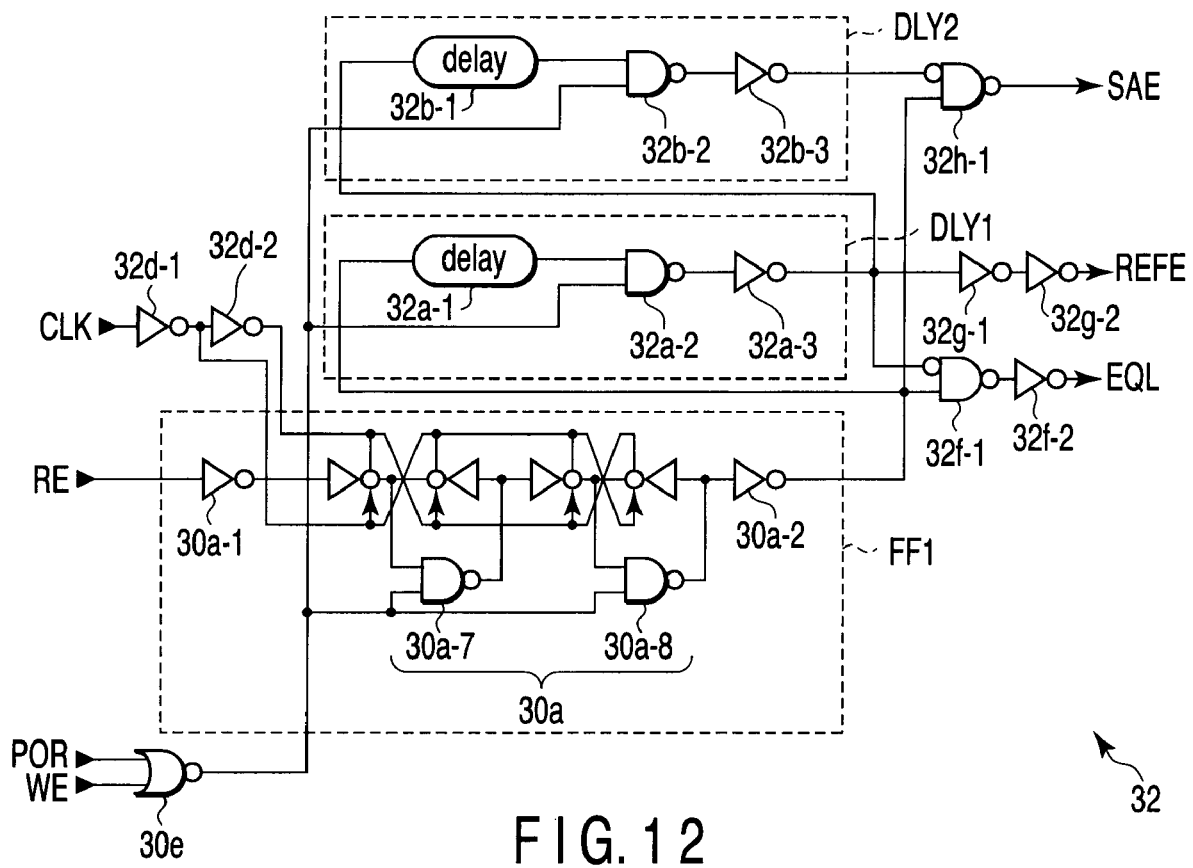
FIG. 12 is a circuit diagram showing a configuration of a read operation control sequential circuit in the memory shown in FIG. 11.

FIG. 12 shows an example of the configuration of the read operation control sequential circuit 32 described above. In the third embodiment, the asynchronous reset terminal of the circuit 32 is controlled by the NOR output of a power-on reset signal POR and a write operation instruction signal WE. Each component common to the circuits 31 and 32 of the second and third embodiments is denoted by the same reference numeral and its detailed description is omitted.

Referring to FIG. 12, the read operation control sequential circuit 32 includes one flip-flop FF1 and two delay circuits DLY1 and DLY2. The flip-flop FF1 receives a read operation instruction signal RE. It also receives an external input clock CLK via an inverter 32d-1. It also receives an external input clock CLK via both inverters 32d-1 and 32d-2. The flip-flop FF1 includes an asynchronous reset terminal 30a (NAND circuits 30a-7 and 30a-8). The asynchronous reset terminal 30a is supplied with the output of a NOR circuit 32e, or the result of NOR logic (NOR output) of the power-on reset signal POR and write operation instruction signal WE.

The delay circuit DLY1 includes a delay element 32a-1, a NAND circuit 32a-2 and an inverter 32a-3. The delay circuit DLY2 includes a delay element 32b-1, a NAND circuit 32b-2 and an inverter 32b-3. One input terminal of each of the NAND circuits 32a-2 and 32b-2 is supplied with the output of the NOR circuit 32e. The other input terminal of the NAND circuit 32a-2 is supplied with the output of the inverter 30a-2 through the delay element 32a-1. The output of the inverter 30a-2 corresponds to that of the flip-flop FF1. The other input terminal of the NAND circuit 32b-2 is supplied with the output of the inverter 32a-3 through the delay element 32b-1. The output of the inverter 32a-3 corresponds to that of the delay circuit DLY1.

A NAND circuit 32f-1 and an inverter 32f-2 are connected in series in a stage subsequent to the output stage of the flip-flop FF1. The output of the inverter 30a-2, which is the output of the flip-flop FF1, is supplied to the noninverting input terminal of the NAND circuit 32f-1, and the output of the inverter 32a-3, which is the output of the delay circuit DLY1, is supplied to the inverting input terminal thereof. Thus, the equalize signal EQL is taken out of the output terminal of the inverter 32f-2.

Inverters 32g-1 and 32g-2 are connected in series in a stage subsequent to the output stage of the delay circuit DLY1. The output of the inverter 32a-3, which is the output of the delay circuit DLY1, is taken out as a reference potential control signal REFE to generate a reference potential VREF in a reference potential generating power supply (not shown).

A NAND circuit 32h-1 is provided in a stage subsequent to the output stage of the delay circuit DLY2. The output of the inverter 32b-3, which is the output of the delay circuit DLY2, is supplied to the inverting input terminal of the NAND circuit 32h-1, and the output of the inverter 30a-2, which is the output of the flip-flop FF1, is supplied to the noninverting input terminal thereof. The differential amplifier control signal SAE is thus output from the output terminal of the NAND circuit 32h-1.

Figure 13:
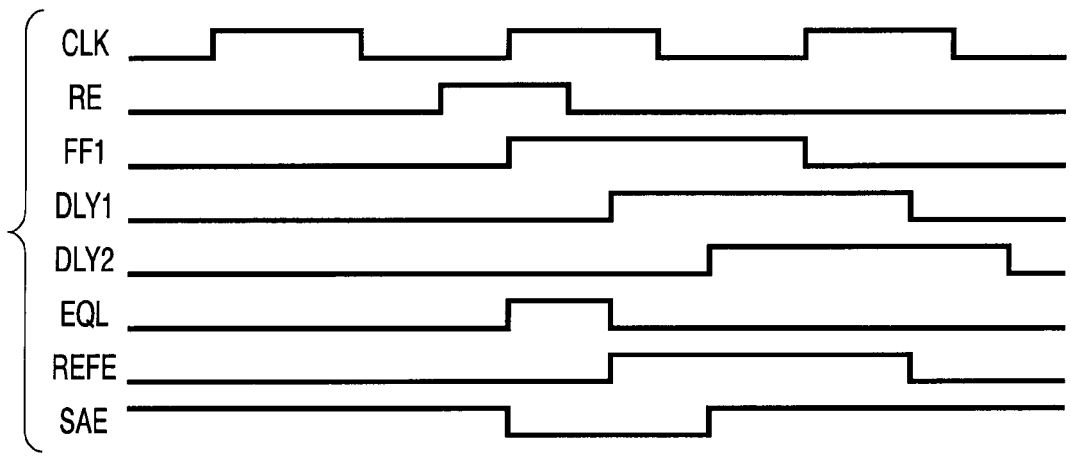
FIG. 13 is a timing chart illustrating the operation of the read operation control sequential circuit shown in FIG. 12.

FIG. 13 illustrates a basic read operation of the read operation control sequential circuit 32 described above. The flip-flop FF1 captures a read operation instruction signal RE at the rise of the external input clock CLK and activates an equalize signal EQL to control the equalize gate 15. Simultaneously, the flip-flop FF1 inactivates the differential amplifier control signal SAE to control the differential amplifier 17'. After that, the flip-flop FF1 returns the equalize signal EQL to an inactive state at the rise of the delay circuit DLY1. Simultaneously, the flip-flop FF1 activates a reference potential control signal REFE to control the generation of a reference potential VREF. After that, the flip-flop FF1 activates the differential amplifier control signal SAE again at the rise of the delay circuit DLY2. The reference potential control signal REFE is returned to an inactive state at the fall timing of the delay circuit DLY1.

The third embodiment can bring about the same advantages as those of the first and second embodiments. Assume here that a write operation instruction signal WE is input at unexpected timing such as during read operation. Then, the output of the NOR circuit 32e is supplied to the asynchronous reset terminal 30a of the flip-flop FF1 and the NAND circuits 32a-2 and 32b-2 of the delay circuits DLY1 and DLY2. The read operation control sequential circuit 32 inactivates the equalize signal EQL, differential amplifier control signal SAE and reference potential control signal REFE at once. Even though the write operation instruction signal WE is input during the read operation, the read operation can be stopped immediately to avoid the risk of destroying the elements of the circuits.

The operation of the memory shown in FIG. 11, which is performed when the memory is supplied with a write operation instruction signal WE during the read operation, will be described briefly. Upon receiving a read operation instruction signal RE, the read operation control sequential circuit 32 activates the equalize signal EQL, reference potential control signal REFE and differential amplifier control signal SAE in sequence at the up edge of the clock signal ICLK to perform a read operation.

When the write operation control combination circuit 20 receives a write operation instruction signal WE in the above state, it outputs a write control signal SL of VDD (e.g., 1.5 V) to activate the write gate 13 (see FIG. 11).

Simultaneously, the result of NOR logic obtained by the input of the write operation instruction signal WE is supplied to the asynchronous reset terminal 30a of the read operation control sequential circuit 32 and the NAND circuits 32a-2 and 32b-2 of the delay circuits DLY1 and DLY2. Then, the circuit 32 initializes the equalize signal EQL, reference potential control signal REFE and differential amplifier control signal SAE at once to stop the read operation. The memory can thus prevent the elements such as the equalize gate 15 from being destroyed even if it is supplied with the write operation instruction signal WE at unexpected timing.

As described above, the third embodiment can bring about the same advantages as those of the second embodiment. The write operation control combination circuit 20 that is supplied with a write operation instruction signal WE is configured by a simple combination logic circuit. In contrast, the read operation control sequential circuit 32 that is supplied with a read operation instruction signal RE and an external input clock CLK has a relatively complicated configuration including a sequential circuit, and includes an asynchronous reset terminal 30a that is supplied with the write operation instruction signal WE. Even though the memory receives a write operation instruction signal WE at unexpected timing, its read operation can be stopped at once. Consequently, the elements of the circuits can be prevented from being destroyed to perform a write operation with reliability.

In the third embodiment, too, when the memory is sealed with a package or mounted on a board, a write operation instruction signal WE can be supplied directly to the ground potential VSS (e.g., 0 V) to reduce the risk of erroneous writing greatly. In other words, data can be prevented from being lost by erroneous writing even though power is suddenly stopped (instantaneous power failure) or a soft error is caused in the internal node by the influence of radiation.

FOURTH EMBODIMENT

Figure 14:
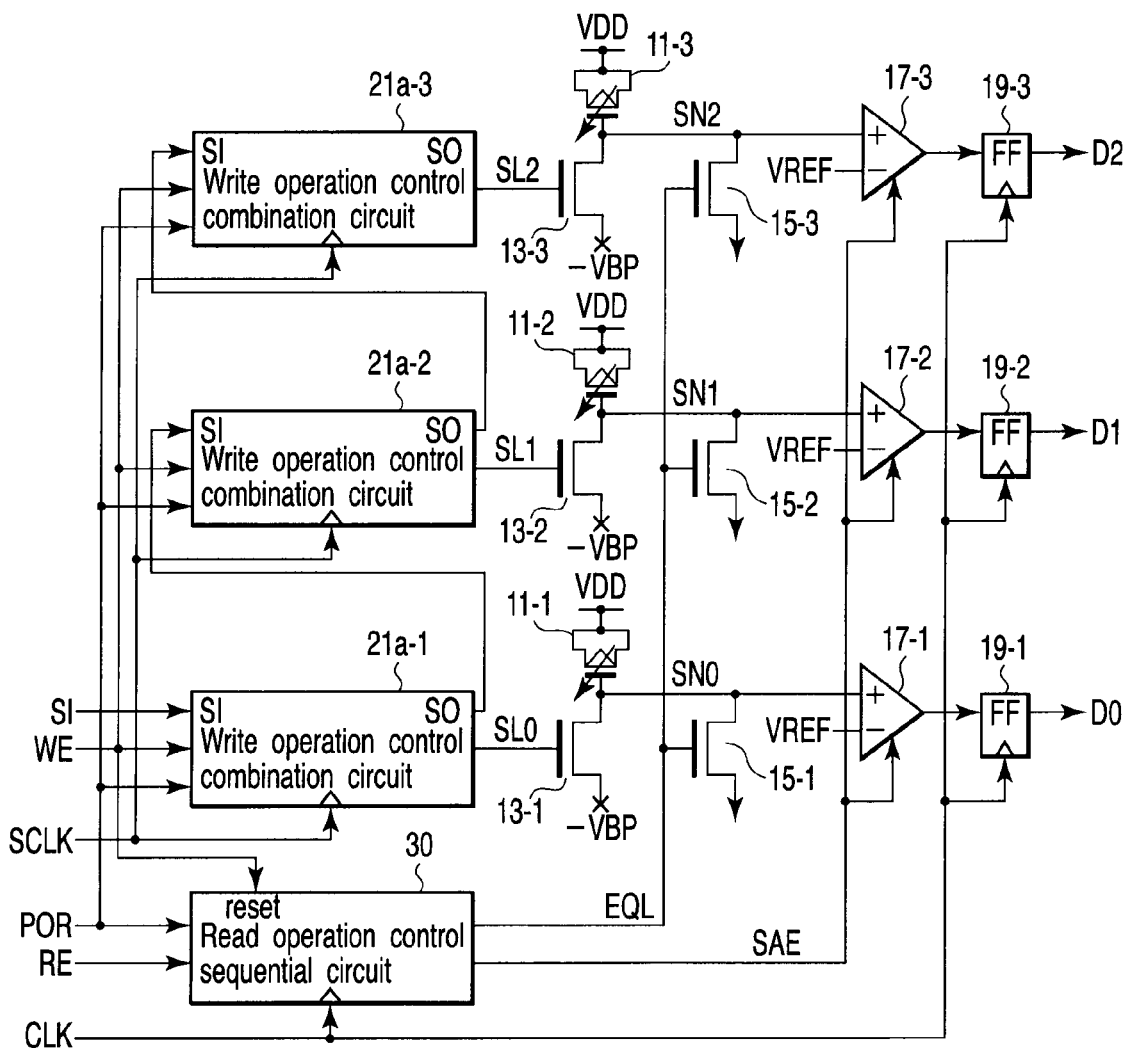
FIG. 14 is a circuit diagram showing a configuration of a nonvolatile semiconductor memory device (one-time programmable memory) according to a fourth embodiment of the present invention.

FIG. 14 shows a basic configuration of a nonvolatile semiconductor memory device according to a fourth embodiment of the present invention. The fourth embodiment is directed to a one-time programmable memory using an anti-fuse storage element of an irreversible gate-oxide-film destruction type, to which data (information) cannot be rewritten. In this memory, the number of anti-fuse storage elements is plural (the number of bits is three, for example). Each component common to FIGS. 1 and 14 is denoted by the same reference numeral and its detailed description is omitted.

In the fourth embodiment, the memory includes one read operation control sequential circuit for controlling a read operation and three write operation control combination circuits for controlling a write operation. A write operation instruction signal WE for giving an instruction to start a write operation is input to each of the write operation control combination circuits and then supplied to an asynchronous reset terminal (reset circuit) of the read operation control sequential circuit. The read operation control sequential circuit is therefore reset immediately and brought into a write standby state. The write operation instruction signal WE is input asynchronously with an external input clock CLK.

In the fourth embodiment, each of the write operation control combination circuits is newly supplied with an input signal SI and a clock SCLK for controlling whether to write data to the anti-fuse storage elements. An output signal SO for sending write data is prepared for the next bit (write operation control combination circuit). For example, the output signal SO of a write operation control combination circuit in the preceding stage corresponds to the input signal SI of a write operation control combination circuit in the subsequent stage.

As described above, the memory includes one read operation control sequential circuit 30 and three write operation control combination circuits 21a-1, 21a-2 and 21a-3, as shown in FIG. 14. The gates of write gates 13-1, 13-2 and 13-3 are connected to the circuits 21a-1, 21a-2 and 21a-3, respectively. A power supply of negative potential −VBP is connected to the source of each of the write gates 13-1, 13-2 and 13-3. One terminal (gate) of each of anti-fuse storage elements 11-1, 11-2 and 11-3, which serve as storage nodes SN0, SN1 and SN2, is connected to a corresponding one of the drains of the write gates, while the other terminal (source and drain) thereof is connected to a power supply VDD.

The drains of equalize gates 15-1, 15-2 and 15-3 are connected to the storage nodes SN0, SN1 and SN2, respectively, as are the noninverting input terminals of differential amplifiers 17-1, 17-2 and 17-3. The sources of the equalize gates 15-1, 15-2 and 15-3 are grounded (connected to the ground potential VSS).

The inverting input terminals of the differential amplifiers 17-1, 17-2 and 17-3 are supplied with their respective reference potentials VREF from a reference potential generating power supply (not shown). Output buffers 19-1, 19-2 and 19-3 are connected to their respective output terminals of the differential amplifiers 17-1, 17-2 and 17-3. The output buffers 19-1, 19-2 and 19-3 output data D0, D1 and D2 outside the memory in synchronization with the external input clock CLK.

The read operation control sequential circuit 30 starts a read operation upon receipt of a read operation instruction signal RE for giving an instruction to start a read operation, and controls the timing of the read operation in synchronization with the external input clock CLK. The signal RE is input in synchronization with the external input clock CLK. The circuit 30 outputs an equalize signal EQL for controlling the equalize gates 15-1, 15-2 and 15-3, a differential amplifier control signal SAE for controlling the differential amplifiers 17-1, 17-2 and 17-3, and a reference potential control signal (REFE) for generating a reference potential VREF from the reference potential generating power supply (not shown).

The read operation control sequential circuit 30 includes an asynchronous reset terminal (reset circuit) for resetting a read operation upon receipt of a power-on reset signal POR and a write operation instruction signal WE (see FIG. 2).

The write operation control combination circuits 21a-1, 21a-2 and 21a-3 control a write operation in accordance with the state of a write operation instruction signal WE. These circuits supply write control signals SL0, SL1 and SL2 to the gates of the write gates 13-1, 13-2 and 13-3. The write operation instruction signal WE is input asynchronously with the external input clock CLK.

The write operation control combination circuit 21a-1 of the first stage receives an input signal SI and a clock SCLK and supplies its output signal SO to the write operation control combination circuit 21a-2 of the next stage. The output signal SO corresponds to the input signal SI of the circuit 21a-2. Similarly, the write operation control combination circuit 21a-2 of the next stage receives the input signal SI and clock SCLK and supplies its output signal SO to the write operation control combination circuit 21a-3 of the final stage. The output signal SO corresponds to the input signal SI of the circuit 21*a*-3. The circuit 21*a*-3 only receives the input signal SI and clock SCLK (the circuit 21*a*-3 does not supply its output signal SO).

FIG. 15 shows an example of the write operation control combination circuits 21*a*-1, 21*a*-2 and 21*a*-3 described above. Each component common to these circuits and the circuit 20 of the first embodiment is denoted by the same reference numeral and its detailed description is omitted.

In the fourth embodiment, the write operation control combination circuits 21*a*-1, 21*a*-2 and 21*a*-3 each have a function of a negative level shifter (see FIG. 4). The circuits 21*a*-1, 21*a*-2 and 21*a*-3 also have a function of a flip-flop for detecting the state of an input signal SI at the rise of the clock SCLK and generating an output signal SO to permit a write operation control combination circuit of the next stage to perform a write operation (see the flip-flop FF1 shown in FIG. 2, for example). The circuits 21*a*-1, 21*a*-2 and 21*a*-3 include a negative-level shifter LS and a flip-flop FF1, as shown in FIG. 15. The negative-level shifter LS includes one NAND circuit 21-11 in place of the CMOS inverter 20*a* and also includes four CMOS inverters 20*b*, 20*c*, 20*d* and 20*e*. One input terminal of the NAND circuit 21-11 is supplied with the write operation instruction signal WE, while the other input terminal thereof is supplied with the output (output signal SO) of the flip-flop FF1.

Inverters 21*d*-1 and 21*d*-2 are connected in series in a stage precedent to the input stage of the flip-flop FF1. The flip-flop FF1 is supplied with the clock SCLK via the inverter 21*d*-1 and also via the inverters 21*d*-1 and 21*d*-2. An inverter 30*a*-1 is provided in the input stage of the flip-flop FF1 and an inverter 30*a*-2 is provided in the output stage thereof. The input signal SI is supplied to the input terminal of the inverter 30*a*-1 and thus the output signal SO is output from the output terminal of the inverter 30*a*-2.

An inverter 21*e* is provided in a stage precedent to the input stage of the flip-flop FF1. The input terminal of the inverter 21*e* is supplied with a power-on reset signal POR, while the output terminal thereof is connected to an asynchronous reset terminal 30*a* (NAND circuits 30*a*-7 and 30*a*-8) for initializing the flip-flop FF1.

A basic write operation of the memory according to the fourth embodiment will be described. First, a power supply voltage VDD (e.g., 1.5 V) is applied to the memory to change a power-on reset signal POR to the power supply voltage VDD once. Then, the power-on reset signal POR is returned to the ground potential VSS and its state is maintained. With this operation, the state of the flip-flop FF1 of each of the write operation control combination circuits 21*a*-1, 21*a*-2 and 21*a*-3 is initialized.

After that, the input signal SI is set at the power supply voltage VDD or ground potential VSS according to whether to write data to the anti-fuse storage elements 11-1, 11-2 and 11-3, and a clock SCLK is input. The input signal SI in this state corresponds to write data. The write data is sent to the flip-flop FF1 of the write operation control combination circuit 21*a*-1 at the rise edge of the clock SCLK and simultaneously it is supplied to the write operation control combination circuit 21*a*-2 of the next stage as an output signal SO. The output signal SO corresponds to the input signal SI of the write operation control combination circuit 21*a*-2. The write data, which is input to the circuit 21*a*-1 as the input signal SI, is sent to the circuits 21*a*-2 and 21*a*-3 any time at the rise edge of the clock SCLK.

If write data is set in the flip-flops FF1 in all of the write operation control combination circuits 21*a*-1, 21*a*-2 and 21*a*-3, the input of the clock SCLK is stopped and the input signal SI is maintained at the ground potential VSS. The operation that has been described so far is a write data setting operation.

Data starts to be written to the anti-fuse storage elements 11-1, 11-2 and 11-3. To do so, first, a largely negative write power supply voltage −VBP (e.g., −5.5 V) is applied. Under this condition, the potential of the write operation instruction signal WE changes from the ground potential VSS to the power supply voltage VDD. In one of the write operation control combination circuits 21*a*-1, 21*a*-2 and 21*a*-3 whose flip-flop FF1 stores write data, or whose output signal SO is set at the power supply voltage VDD, its write control signal (one of SL0, SL1 and SL2) is set at the power supply voltage VDD while the write operation instruction signal WE is at the power supply voltage VDD. In the other write operation control combination circuits, their write control signals are maintained at the negative power supply voltage −VBP.

If the write control signals SL0, SL1 and SL2 are set at the power supply voltage VDD, their corresponding write gates 13-1, 13-2 and 13-3 are turned on. Thus, a high-voltage stress is applied to the anti-fuse storage elements 11-1, 11-2 and 11-3 and data "1" is stored therein.

The operation of the memory shown in FIG. 14, which is performed when the memory is abnormally supplied with a write operation instruction signal WE, will be described briefly. Upon receiving a read operation instruction signal RE, the read operation control sequential circuit 30 activates the equalize signal EQL, reference potential control signal REFE and differential amplifier control signal SAE to perform a read operation.

If the memory is abnormally supplied with a write operation instruction signal WE in the above state, the result of NOR logic (NOR output) is input to the asynchronous reset terminals 30*a*, 30*b* and 30*c* of the read operation control sequential circuit 30. Then, the circuit 30 inactivates the equalize signal EQL, reference potential control signal REFE and differential amplifier control signal SAE at once to stop the read operation (see the first embodiment, for example).

When the memory is supplied with a write operation instruction signal WE, the write operation control combination circuits 21*a*-1, 21*a*-2 and 21*a*-3 activate the write gates 13-1, 13-2 and 13-3. If the signal WE is abnormal, the negative-level shifter LS continues to maintain the write control signals SL0, SL1 and SL2 at the negative power supply voltage −VBP. More specifically, during the power-on of the memory, the inversion signal of the power-on reset signal POR (output of inverter 21*e*) is input to the asynchronous reset terminal 30*a* of each of the write operation control combination circuits 21*a*-1, 21*a*-2 and 21*a*-3. In read operation, therefore, the output signal SO of the flip-flop FF1 of each of the circuits 21*a*-1, 21*a*-2 and 21*a*-3 is set at the ground potential VSS. Even though the potential of the write operation instruction signal WE is being held at the power supply voltage VDD, the write control signals SL0, SL1 and SL2, which are output from the negative-level shifter LS, are continuously maintained at the negative power supply voltage −VBP.

If the write operation instruction signal WE is abnormal, generally, write data is not input simultaneously with the signal WE. Consequently, data can be prevented from being written erroneously and an element can be prevented from being destroyed.

In the fourth embodiment, it is important that the write operation instruction signal WE be input to the asynchronous reset terminals 30*a*, 30*b* and 30*c* of the flip-flops FF1, FF2 and FF3 of the read operation control sequential circuit 30, as in the first embodiment described above. It is commonly known that the state of a sequential circuit such as a latch circuit and a flip-flop becomes unstable immediately after power is turned on or after power is suddenly stopped (instantaneous power failure) or the state is inverted by radiation (soft error). Even though such a problem occurs, the memory of the fourth embodiment can prevent an erroneous operation such as an error in writing. In other words, when the read operation control sequential circuit 30 malfunctions, the read operation stops at once and changes to an operation for preparing a write operation. Thus, an unexpected high-voltage stress can be prevented from being applied to the anti-fuse storage elements 11-1, 11-2 and 11-3 and thus data can be prevented from being written erroneously.

A memory using the anti-fuse storage elements 11-1, 11-2 and 11-3 frequently performs a data write operation in its manufacturing process, e.g., a testing step. Even though a write operation instruction signal WE is erroneously input in the testing step, the read operation stops at once and changes to an operation for preparing a write operation. An unexpected high-voltage stress can thus be prevented from being applied to the write gate and equalize gate to avoid the risk of destroying the elements. In particular, when no write data is set in the flip-flops FF1, FF2 and FF3 in the write operation control sequential circuit 30, no high-voltage stress is applied to the anti-fuse storage elements 11-1, 11-2 and 11-3. When a write operation is carried out in the testing step, the probability of occurrence of erroneous operations can greatly be decreased by supplying a power-on reset signal POR reliably when power is turned on.

As described above, the fourth embodiment can bring about the same advantages as those of the first embodiment. The write operation control combination circuits 21*a*-1, 21*a*-2 and 21*a*-3 that are supplied with a write operation instruction signal WE are each configured by a combination logic circuit. In contrast, the read operation control sequential circuit 30 that is supplied with a read operation instruction signal RE and an external input clock CLK has a relatively complicated configuration including a sequential circuit, and includes asynchronous reset terminals 30*a*, 30*b* and 30*c* that are supplied with the write operation instruction signal WE. Even though the memory receives a write operation instruction signal WE at unexpected timing, its read operation can be stopped at once. Consequently, the elements of the circuits such as the equalize gates 15-1, 15-2 and 15-3 can be prevented from being destroyed.

Furthermore, the memory of the fourth embodiment can prevent data from being lost due to erroneous writing when the memory is abnormally supplied with a write operation instruction signal WE.

FIFTH EMBODIMENT

Figure 16:
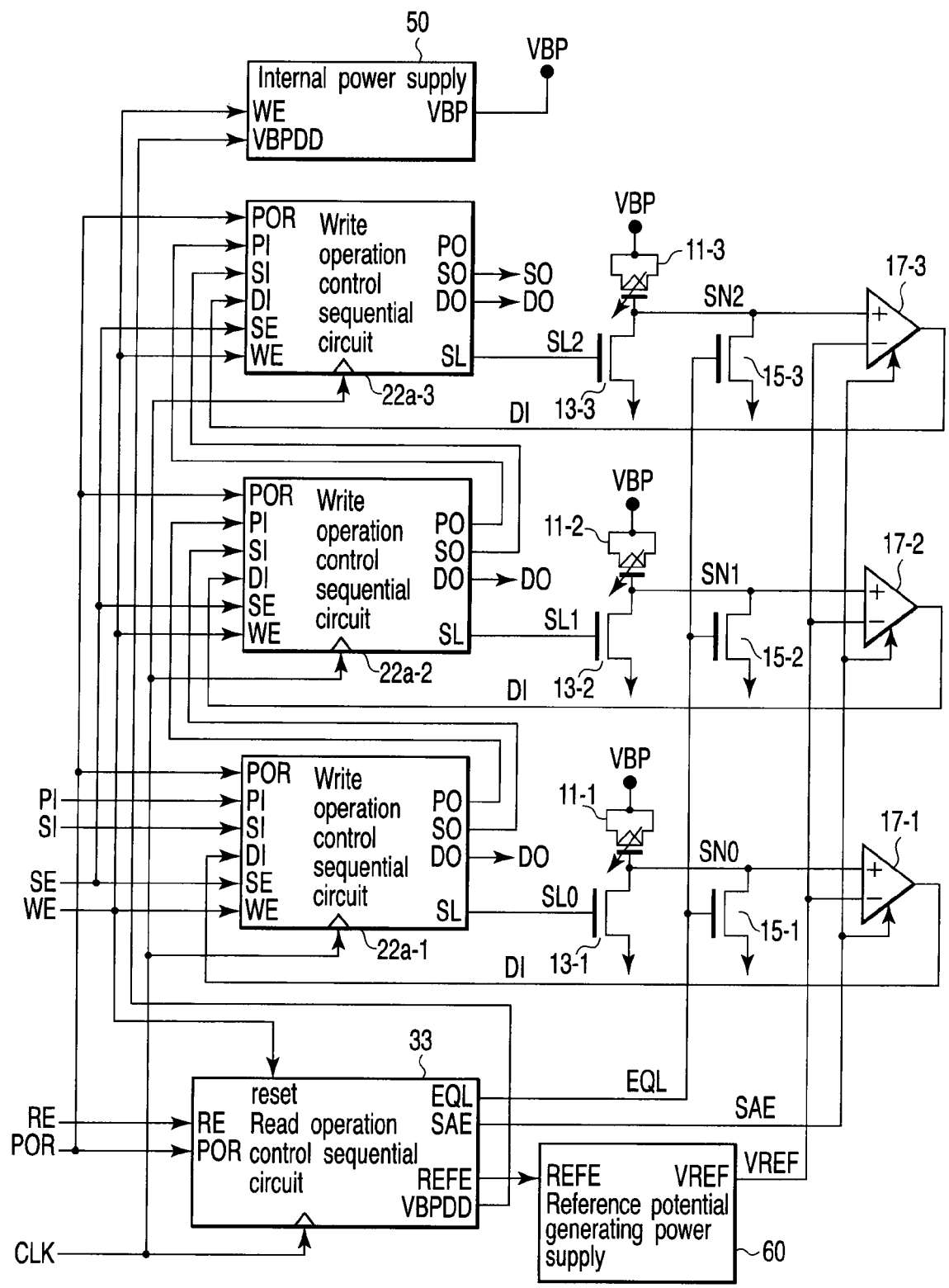
FIG. 16 is a circuit diagram showing a configuration of a nonvolatile semiconductor memory device (one-time programmable memory) according to a fifth embodiment of the present invention.

FIG. 16 shows a basic configuration of a nonvolatile semiconductor memory device according to a fifth embodiment of the present invention. The fifth embodiment is directed to a one-time programmable memory using an anti-fuse storage element of an irreversible gate-oxide-film destruction type, to which data (information) cannot be rewritten. In this memory, the number of anti-fuse storage elements is plural (the number of bits is three, for example). Each component common to FIGS. 14 and 16 is denoted by the same reference numeral and its detailed description is omitted.

In the fifth embodiment, the memory includes one read operation control sequential circuit for controlling a read operation and three write operation control sequential circuits for controlling a write operation. A write operation instruction signal WE for giving an instruction to start a write operation is input to each of the write operation control sequential circuits and then supplied to an asynchronous reset terminal (reset circuit) of the read operation control sequential circuit. The read operation control sequential circuit is therefore reset immediately and brought into a write standby state. Furthermore, the memory is so configured that an internal power supply for applying a power supply voltage (write potential) necessary for writing data to an anti-fuse storage element is operated only when the write operation instruction signal WE is active. The write operation instruction signal WE is input asynchronously with the external input clock CLK.

As described above, the memory includes one read operation control sequential circuit 33 and three write operation control sequential circuits 22*a*-1, 22*a*-2 and 22*a*-3, as shown in FIG. 16. The gates of write gates 13-1, 13-2 and 13-3 are connected to the circuits 22*a*-1, 22*a*-2 and 22*a*-3, respectively. The sources of the write gates 13-1, 13-2 and 13-3 are grounded (connected to the ground of VSS). One terminal (gate) of each of anti-fuse storage elements 11-1, 11-2 and 11-3, which serve as storage nodes SN0, SN1 and SN2, are connected to a corresponding one of the drains of the write gates, while the other terminal (source and drain) thereof is connected to an internal power supply VBP of first internal power supply potential which is the output of an internal power supply 50.

The drains of equalize gates 15-1, 15-2 and 15-3 are connected to the storage nodes SN0, SN1 and SN2, respectively, as are the noninverting input terminals of differential amplifiers 17-1, 17-2 and 17-3. The sources of the equalize gates 15-1, 15-2 and 15-3 are grounded (connected to the ground of VSS).

The inverting input terminals of the differential amplifiers 17-1, 17-2 and 17-3 are each supplied with a reference potential VREF from a reference potential generating power supply 60. The output terminals of the differential amplifiers 17-1, 17-2 and 17-3 are connected to their respective write operation control sequential circuits 22*a*-1, 22*a*-2 and 22*a*-3 each serving as an output buffer. The output data (D0, D1, and D2) of the differential amplifiers 17-1, 17-2 and 17-3 are captured into the circuits 22*a*-1, 22*a*-2 and 22*a*-3 as input data DI and then output therefrom (outside the memory) as output data DO.

The read operation control sequential circuit 33 starts a read operation upon receiving a read operation instruction signal RE for giving an instruction to start a read operation and controls the timing of the read operation in synchronization with the external input clock CLK. The signal RE is input in synchronization with the external input clock CLK. The circuit 33 outputs an equalize signal EQL for controlling the equalize gates 15-1, 15-2 and 15-3, a differential amplifier control signal SAE for controlling the differential amplifiers 17-1, 17-2 and 17-3, and a reference potential control signal REFE for generating a reference potential VREF from the reference potential generating power supply 60.

The read operation control sequential circuit 33 is configured to supply the internal power supply 50 with a VBP direct drive signal VBPDD.

The circuit 33 includes an asynchronous reset terminal (reset circuit) for resetting a read operation upon receipt of a write operation instruction signal WE and a power-on reset signal POR.

The write operation control sequential circuits 22*a*-1, 22*a*-2 and 22*a*-3 control a write operation. When the write operation instruction signal WE is "0" and serial access activation signal (scan activation signal) SE is "1," the circuits 22*a*-1, 22*a*-2 and 22*a*-3 capture an input signal SI into an internal register (described in detail later) at the rise of the external input clock CLK. If the signal WE becomes "1"

when the state of the internal register is "1," data "1" is output as write control signals SL0, SL1 and SL2 for controlling the write gates 13-1, 13-2 and 13-3 while the external input clock CLK is "1."

The write operation control sequential circuits 22a-1 and 22a-2 of each stage supply an output signal SO to their respective write operation control sequential circuits 22a-2 and 22a-3 of the stage subsequent thereto. The output signal SO corresponds to a signal SI input to each of the circuits 22a-2 and 22a-3.

The write operation control sequential circuits 22a-1, 22a-2 and 22a-3 include an asynchronous reset terminal (reset circuit) for resetting a write operation in standby state upon receipt of a power-on reset signal POR.

The internal power supply 50 generates an internal power supply voltage VBP upon receipt of the write operation instruction signal WE and VBP direct drive signal VBPDD. In write operation, the internal power supply 50 generates a high potential (e.g., 7 V) necessary for writing data to the anti-fuse storage elements 11-1, 11-2 and 11-3, as the internal power supply voltage VBP. In read operation, the internal power supply 50 generates a potential (e.g., 1.5 V) enough to read data from the anti-fuse storage elements 11-1, 11-2 and 11-3 without destroying the data.

The reference potential generating power supply 60 generates a reference potential VREF upon receipt of the reference potential control signal REFE from the read operation control sequential circuit 33. The signal REFE is supplied to each of the differential amplifiers 17-1, 17-2 and 17-3.

Figure 17:
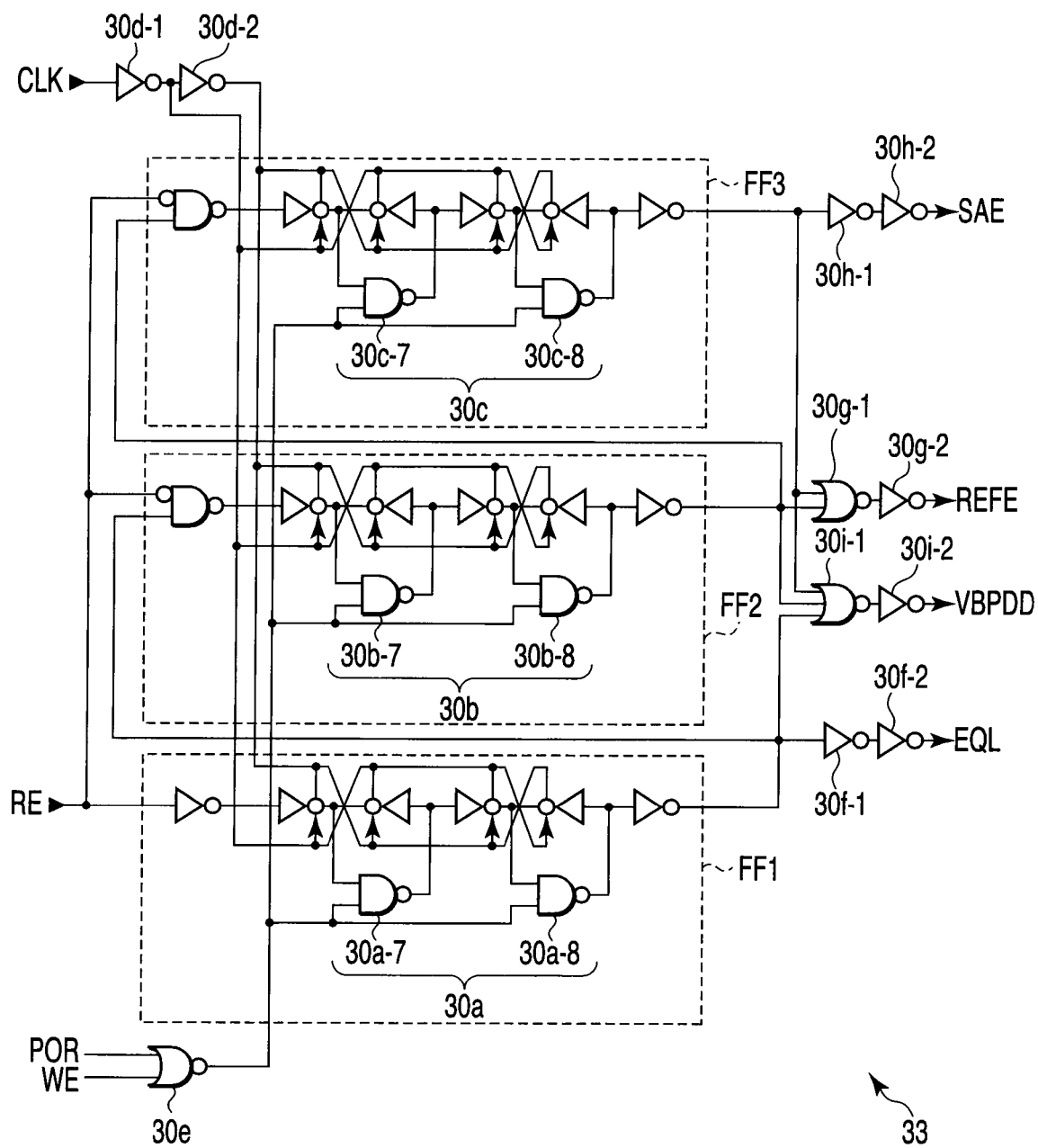
FIG. 17 is a circuit diagram showing a configuration of a read operation control sequential circuit in the memory shown in FIG. 16.

FIG. 17 shows an example of the read operation control sequential circuit 33 described above. Each component to the circuit 33 and the circuit 30 of the first embodiment is denoted by the same reference numeral and its detailed description is omitted.

The read operation control sequential circuit 33 is configured by providing the output stage of the read operation control sequential circuit 30 shown in FIG. 2 with a NOR circuit 301-1 and an inverter 301-2 which are connected in series. In other words, a VBP direct drive signal VBPDD is generated by setting the outputs of flip-flops FF1, FF2 and FF3 as the inputs of the NOR circuit 30i-1.

The read operation control sequential circuit 33 is configured to reset the operation of the internal sequential circuit (flip-flops FF1, FF2, FF3) to return to the initial state, or the standby state.

Figure 18:
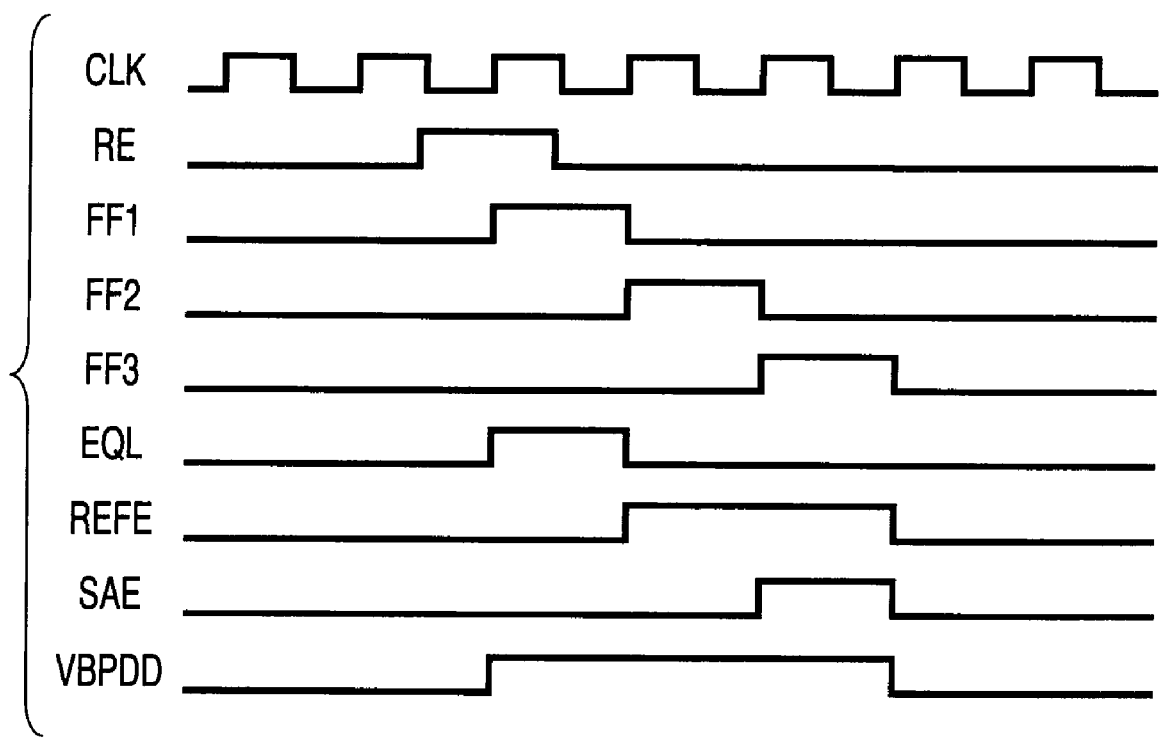
FIG. 18 is a timing chart illustrating the operation of the read operation control sequential circuit shown in FIG. 17.

FIG. 18 illustrates a basic read operation of the read operation control sequential circuit 33 described above. The flip-flop FF1 of the first stage captures a read operation instruction signal RE at the rise of the external input clock CLK and activates an equalize signal EQL that controls the equalize gates 15-1, 15-2 and 15-3 and a VBP direct drive signal VBPDD that controls the internal power supply 50. Thus, the internal power supply 50 generates a potential (e.g., 1.5 V) necessary for a read operation, as the internal power supply voltage VBP that is applied to each of the anti-fuse storage elements 11-1, 11-2 and 11-3.

Then, the flip-flop FF1 returns the equalize signal EQL to an inactive state at the next rise of the external input clock CLK. Simultaneously, the flip-flop FF2 of the next stage activates the reference potential control signal REFE that controls the reference potential generating power supply 60.

The flip-flop FF3 activates the differential amplifier control signal SAE at the next rise of the external input clock CLK. The VBP direct drive signal VBPDD, differential amplifier control signal SAE and reference potential control signal REFE are each returned to an inactive state at the next rise of the external input clock CLK.

The read operation control sequential circuit 33 may have various configurations other than that shown in FIG. 17. It is generally desirable to configure the circuit 33 by a sequential circuit in order to control the timing of a series of read operations. In the fifth embodiment, the sequential circuit includes three flip-flops FF1, FF2 and FF3. These flip-flops FF1, FF2 and FF3 include asynchronous reset terminals 30a (30a-7, 30a-8), 30b (30b-7, 30b-8) and 30c (30c-7, 30c-8), respectively. The asynchronous reset terminals 30a, 30b and 30c are supplied with a NOR output (30e) of the write operation instruction signal WE and power-on reset signal POR. Even though the write operation instruction signal WE is input erroneously during read operation, the read operation can be stopped at once to avoid the risk of destroying the elements. In this case, a write operation is brought into an enabled state (standby state to wait for data) at once. This stage can prevent data from being lost by a malfunction caused when power is turned off or it is turned on again.

Figure 19:
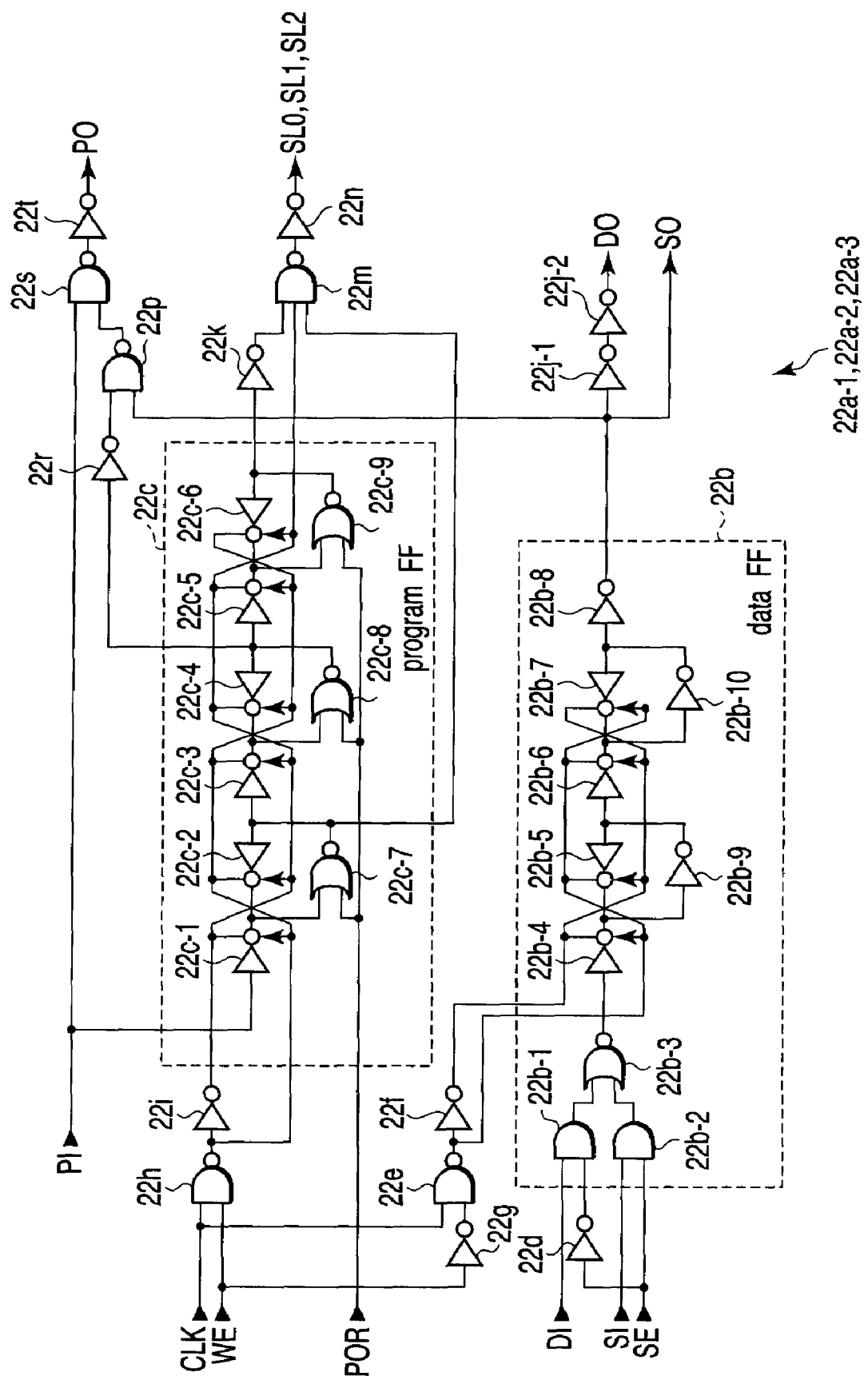
FIG. 19 is a circuit diagram showing a configuration of a write operation control sequential circuit in the memory shown in FIG. 16.

FIG. 19 shows an example of the write operation control sequential circuits 22a-1, 22a-2 and 22a-3 described above. In the fifth embodiment, the circuits 22a-1, 22a-2 and 22a-3 each include a data flip-flop (data FF) 22b for holding data and a program flip-flop (program FF) 22c for controlling the timing of a write operation.

The data flip-flop 22b includes two AND circuits 22b-1 and 22b-2, one NOR circuit 22b-3, four clocked inverters 22b-4, 22b-5, 22b-6 and 22b-7 connected in series, and three inverters 22b-8, 22b-9 and 22b-10. The data flip-flop 22b also serves as an output buffer. One input terminal of the AND circuit 22b-1 is supplied with output data (input data DI) of the differential amplifiers 17-1, 17-2 and 17-3, while the other input terminal thereof is directly supplied with a serial access activation signal SE through the inverter 22d. One input terminal of the AND circuit 22b-2 is supplied with an input signal SI, while the other input terminal thereof is supplied with the serial access activation signal SE. The output terminals of the AND circuits 22b-1 and 22b-2 are connected to the input terminals of the NOR circuit 22b-3.

The output terminal of a NAND circuit 22e is connected to one control terminal of the clocked inverter 22b-4 whose input terminal is supplied with the output of the NOR circuit 22b-3, one control terminal of the clocked inverter 22b-5 whose output terminal is connected to that of the clocked inverter 22b-4, one control terminal of the clocked inverter 22b-6 whose input terminal is connected to that of the clocked inverter 22b-5, and one control terminal of the clocked inverter 22b-7 whose output terminal is connected to that of the clocked inverter 22b-6. The output terminal of the NAND circuit 22e is also connected to the other control terminal of the clocked inverter 22b-4, the other control terminal of the clocked inverter 22b-5, the other control terminal of the clocked inverter 22b-6, and the other control terminal of the clocked inverter 22b-7 through an inverter 22f. One input terminal of the NAND circuit 22e is supplied with the external input clock CLK, while the other input terminal thereof is supplied with the write operation instruction signal WE through an inverter 22g.

The data flip-flop 22b outputs the output of the inverter 22b-8, which is provided in the output stage, as the output signal SO. The data flip-flop 22b also outputs the output of the inverter 22b-8 as the output data DO through two inverters 22j-1 and 22j-2 connected in series.

In the fifth embodiment, a so-called scan path is provided as a means for inputting/outputting the state of the data flip-flop 22b (the state of the internal register). The output signal SO of the write operation control sequential circuits 22a-1 and 22a-2 of the preceding stage is transmitted through the scan path and supplied as an input signal SI to the write operation control sequential circuits 22a-2 and 22a-3 of the subsequent stage. The scan path is enabled by setting the serial access activation signal SE to "1." The scan path receives data as the input signal SI or outputs data as the output signal SO at the rise of the external input clock CLK.

The program flip-flop 22c includes six clocked inverters 22c-1, 22c-2, 22c-3, 22c-4, 22c-5 and 22c-6 connected in series and three NOR circuits 22c-7, 22c-8 and 22c-9 that make up an asynchronous reset terminal (reset circuit) for initialization. The input terminal of the clocked inverter 22c-1 is supplied with a program signal PI.

The output terminal of a NAND circuit 22h is connected to one control terminal of the clocked inverter 22c-1 whose input terminal is supplied with the program signal PI, one control terminal of the clocked inverter 22c-2 whose output terminal is connected to that of the clocked inverter 22c-1, one control terminal of the clocked inverter 22c-3 whose input terminal is connected to that of the clocked inverter 22c-2, one control terminal of the clocked inverter 22c-4 whose output terminal is connected to that of the clocked inverter 22c-3, one control terminal of the clocked inverter 22c-5 whose input terminal is connected to that of the clocked inverter 22c-4, and one control terminal of the clocked inverter 22c-6 whose output terminal is connected to that of the clocked inverter 22c-5. The output terminal of the NAND circuit 22h is also connected to the other control terminal of the clocked inverter 22c-1, the other control terminal of the clocked inverter 22c-2, the other control terminal of the clocked inverter 22c-3, the other control terminal of the clocked inverter 22c-4, the other control terminal of the clocked inverter 22c-5, and the other control terminal of the clocked inverter 22c-6 through an inverter 22i. One input terminal of the NAND circuit 22h is supplied with the external input clock CLK, while the other input terminal thereof is supplied with the write operation instruction signal WE.

One input terminal of the NOR circuit 22c-7 is connected to the output terminals (mutual connecting node) of the clocked inverters 22c-1 and 22c-2, while the output terminal thereof is connected to the input terminals (mutual connecting node) of the clocked inverters 22c-2 and 22c-3. One input terminal of the NOR circuit 22c-8 is connected to the output terminals (mutual connecting node) of the clocked inverters 22c-3 and 22c-4, while the output terminal thereof is connected to the input terminals (mutual connecting node) of the clocked inverters 22c-4 and 22c-5. One input terminal of the NOR circuit 22c-9 is connected to the output terminals (mutual connecting node) of the clocked inverters 22c-5 and 22c-6, while the output terminal thereof is connected to the input terminal of the clocked inverters 22c-6. The other input terminals of the NOR circuits 22c-7, 22c-8 and 22c-9 are each supplied with a power-on reset signal POR.

The output of the NOR circuit 22c-9, which corresponds to the output of the program flip-flop 22c, is supplied to a first input terminal of a NAND circuit 22m provided in the output stage, through an inverter 22k. The output of the inverter 22i is supplied to a second input terminal of the NAND circuit 22m. The output of the NOR circuit 22c-7 is supplied to a third input terminal of the NAND circuit 22m. The outputs of the NAND circuit 22m are taken out through an inverter 22n and become write control signals SL0, SL1 and SL2.

The output of the inverter 22b-8, which corresponds to the output of the data flip-flop 22b, is supplied to one input terminal of a NAND circuit 22p provided in the output stage. The output of the NOR circuit 22c-8 is supplied to the other input terminal of the NAND circuit 22p through an inverter 22r. The output of the NAND circuit 22p is supplied to one input terminal of a NAND circuit 22s. The program signal PI is supplied to the other input terminal of the NAND circuit 22s. The output of the NAND circuit 22s is taken out through an inverter 22t and become a program enable signal PO.

A basic write operation of the memory according to the fifth embodiment will be described. First, a scan path is enabled by setting the write operation instruction signal WE to "0" and setting the serial access activation signal SE to "1." Each time the external input clock CLK ("1") is input, the data flip-flop 22b, which is an internal register, receives an input signal SI and outputs an output signal SO at the rise of the clock CLK. Repeating this operation, data is sent to the write operation control sequential circuit 22a-1 of the first stage and then the write operation control sequential circuits 22a-2 and 22a-3 of the next stages. Before the write operation, a scan path is used in advance to set data "0" or "1" in the data flip-flop 22b of each of the write operation control sequential circuits 22a-1, 22a-2 and 22a-3.

The external input clock CLK ("1") is input only once while the write operation instruction signal WE is set to "1" and the program signal PI is set to "0."

With this operation, the program flip-flop 22c is reset to "0." While the write operation instruction signal WE is held at "1," the program signal PI is set to "1" and the external input clock CLK ("1") is input again. In the write operation control sequential circuit whose data flip-flop 22b is set to "1," the state of the initial program flip-flop 22c changes from "0" to "1." Simultaneously, the write control signal SL (SL0, SL1, and SL2) becomes "1" while the external input clock CLK is "1." Thus, the write gates 13-1, 13-2 and 13-3 that are supplied with the write control signal SL of "1" are turned on. Consequently, a high-voltage stress (write potential), which is generated by the internal power supply voltage VBP from the internal power supply 50, is applied to the anti-fuse storage elements 11-1, 11-2 and 11-3 that are connected to the turned-on write gates 13-1, 13-2 and 13-3, and data is written to the anti-fuse storage elements 11-1, 11-2 and 11-3.

Simultaneously, a program enable signal PO for enabling the next write operation control sequential circuit to perform a write operation becomes "1." The external input clock CLK is set to "0" once and then the external input clock CLK of "1" is input again. The next write operation control sequential circuit that holds "1" in the data flip-flop 22b operates, and the write control signal SL becomes active, or "1."

In a memory that stores data by applying a high-voltage stress to the anti-fuse storage elements 11-1, 11-2 and 11-3 by the internal power supply 50, it is generally desirable to perform a write operation bit by bit. This is because the internal power supply 50 is reduced in burden and data is written to the anti-fuse storage elements 11-1, 11-2 and 11-3 with reliability. The memory of the fifth embodiment has a function to do so.

Figure 20:
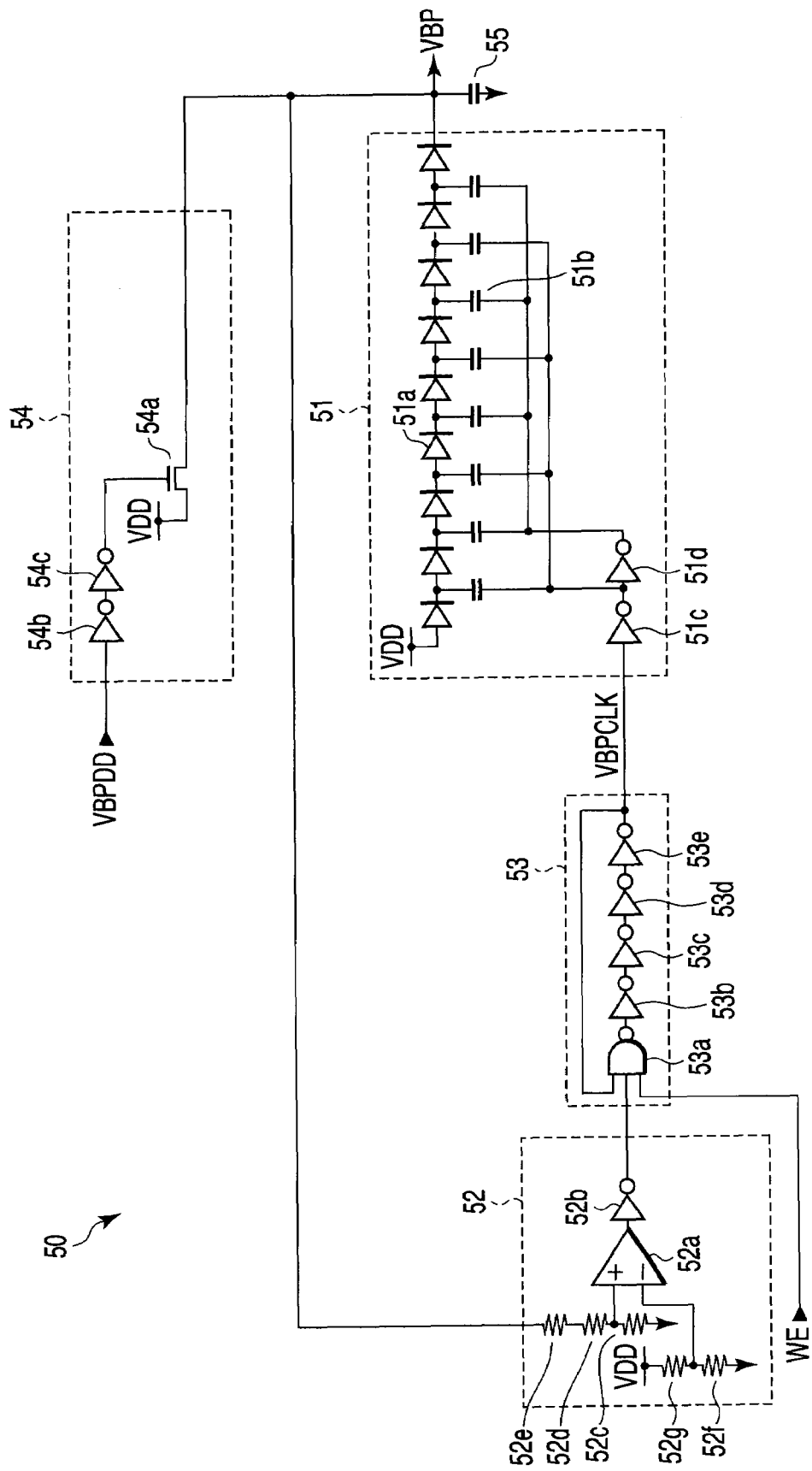
FIG. 20 is a circuit diagram showing a configuration of an internal power supply in the memory shown in FIG. 16.

FIG. 20 shows an example of the configuration of the internal power supply 50 described above. The internal power supply 50 is a step-up power supply for generating a high voltage (e.g., internal power supply voltage VBP=7 V) from a logic power supply voltage (e.g., power supply voltage VDD=1.5 V) in write operation. This high voltage is a write potential necessary for writing data to the anti-fuse storage elements 11-1, 11-2 and 11-3. The internal power supply 50 also generates a read potential (e.g., VBP=1.5 V) necessary for reading data out of the anti-fuse storage elements 11-1, 11-2 and 11-3 efficiently without destroying the elements 11-1, 11-2 and 11-3 or the data stored therein.

Referring to FIG. 20, the internal power supply 50 includes a charging pump 51 for generating the above write potential, a potential control circuit 52 for controlling the potential of the internal power supply voltage VBP and an oscillator 53 for giving hopping timing to the charging pump 51. The charging pump 51 includes a plurality of diodes (nine diodes) 51a connected in series, a plurality of capacitors (eight capacitors) 51b one electrode of each of which is connected to a corresponding mutual connecting node of the diodes 51a, and inverters 51c and 51d which are connected in series and whose output terminals are alternately connected to the other electrodes of the capacitors 51b. The input terminal of the inverter 51c is supplied with an output (VBPCLK) of the oscillator 53. The input terminal of the diode 51a of the first stage is supplied with a logic power supply voltage (VDD). In the charging pump 51, a step-up potential (write potential) is output from the output terminal of the diode 51a of the final stage and supplied outside the internal power supply 50 as the internal power supply voltage VBP.

The potential control circuit 52 includes a differential amplifier 52a, an inverter 52b whose input terminal is connected to the output terminal of the differential amplifier 52a, and a plurality of resistance elements (five resistance elements) 52c, 52d, 52e, 52f and 52g. The noninverting input terminal of the differential amplifier 52a is connected to one end of each of the resistance elements 52c and 52d (a mutual connecting node of the elements) connected in series. The other end of the resistance element 52c is grounded (connected to the ground potential VSS), and the other end of the resistance element 52d is connected to the output terminal of the charging pump 51 via the resistance element 52e. The inverting input terminal of the differential amplifier 52a is connected to one end of each of the resistance elements 52f and 52g (a mutual connecting node of the elements) connected in series. The other end of the resistance element 52f is grounded (connected to the ground potential VSS), and the other end of the resistance element 52g is connected to a logic power supply (VDD). The output of the potential control circuit 52 is taken out of the output terminal of the inverter 52b.

The oscillator 53 includes one NAND circuit 53a and four inverters 53b, 53c, 53d and 53e. These circuit and inverters are connected in series. The NAND circuit 53a has a first input terminal that is supplied with a write operation instruction signal WE, a second input terminal that is supplied with the output of the potential control circuit 52, and a third input terminal that is supplied with the output (VBPCLK) of the inverter 53e.

The internal power supply 50 includes a short circuit 54 for short-circuiting the logic power supply (VDD) and the internal power supply VBP, and a capacitor 55. The short circuit 54 serves as the simplest circuit for generating the above read potential and includes an N-type MOS transistor 54a and inverters 54b and 54c. The source of the N-type MOS transistor 54a is connected to the logic power supply (VDD) and the drain thereof is connected to the output terminal of the charging pump 51. The gate of the N-type MOS transistor 54a is supplied with the VBP direct drive signal VBPDD through the inverters 54b and 54c.

One electrode of the capacitor 55 is connected to the output terminal of the charging pump 51, and the other electrode thereof is grounded (connected to the ground potential VSS).

In the fifth embodiment, the internal power supply 50 is configured to control the generation of a write potential and the stop of the generation in accordance with the state of the write operation instruction signal WE. The importance here is that a circuit for generating a write potential in accordance with the state of the write operation instruction signal WE, or the internal power supply 50 is configured by a combination logic circuit, and it does not include any sequential circuit or it is not controlled by the output signal of a sequential circuit. At least, the internal power supply 50 should not be configured by a circuit that generates a write potential by the output of a sequential circuit. The internal power supply 50 is so configured that its operation is controlled by the state of the write operation instruction signal WE. Even though a sequential circuit is brought into an unexpected state by a sudden stop of power (instantaneous power failure) or the influence of radiation, the internal power supply 50 can be prevented from generating a write potential accidentally.

A write enable circuit (not shown), which corresponds to a password or a key, can be configured by a sequential circuit to prevent the internal power supply from generating a write potential unless the output of the circuit is activated. However, the write enable circuit does not function as a circuit for completely protecting data against erroneous writing (unexpected state) due to the sudden stop of power and the influence of radiation.

As described above, the write operation control circuit is configured by a sequential circuit in order to write data to the memory bit by bit. It is generally like that a sequential circuit such as a flip-flop will be brought into an unexpected state by the sudden stop of power or the influence of radiation. In other words, even though the flip-flop in the write operation control sequential circuit is brought into an unexpected state, the write control signal SL (SL0, SL1, SL2) is not activated by fixing the write operation instruction signal WE to "0." Even though the write operation instruction signal WE ("1") is input unexpectedly, the write control signal SL is not activated unless the external clock CLK ("1") is input or as long as the state of the program flip-flop 22c is "0." Thus, data can be prevented from being erroneously written to the anti-fuse storage elements 11-1, 11-2 and 11-3, and an element such as the equalize gates 15-1, 15-2 and 15-3 can be prevented from being destroyed.

SIXTH EMBODIMENT

Figure 21:
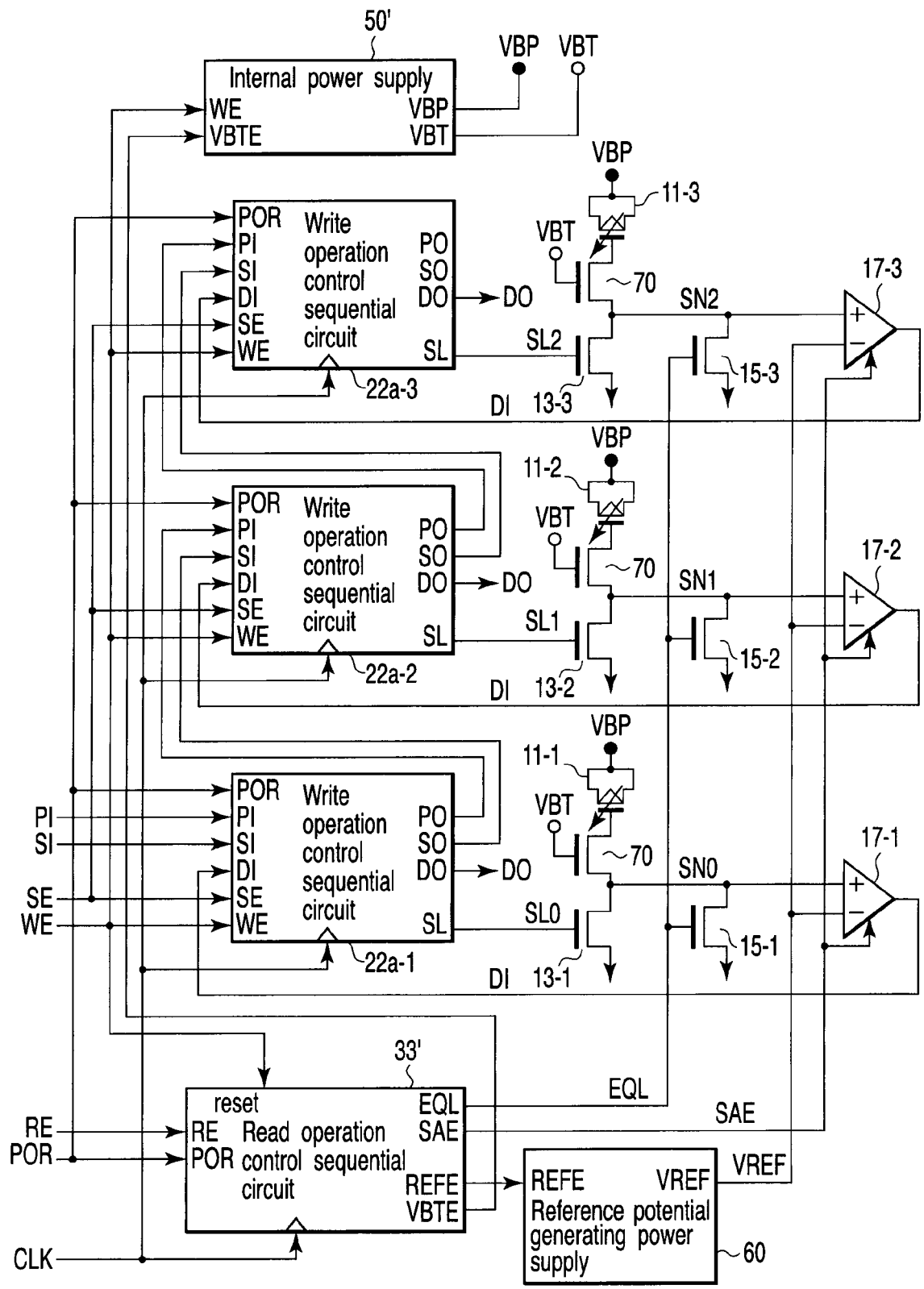
FIG. 21 is a circuit diagram showing a configuration of a nonvolatile semiconductor memory device (one-time programmable memory) according to a sixth embodiment of the present invention.

FIG. 21 shows a basic configuration of a nonvolatile semiconductor memory device according to a sixth embodiment of the present invention. The sixth embodiment is directed to a one-time programmable memory using an anti-fuse storage element of an irreversible gate-oxide-film destruction type, to which data (information) cannot be rewritten. In this memory, the number of anti-fuse storage elements is plural (the number of bits is three, for example). Each component common to FIGS. 16 and 21 is denoted by the same reference numeral and its detailed description is omitted.

In the sixth embodiment, a barrier transistor 70 is added to the memory of the fifth embodiment (see FIG. 16). The barrier transistor 70 is inserted between each of anti-fuse storage elements 11-1, 11-2 and 11-3 and its corresponding one of write gates 13-1, 13-2 and 13-3. The barrier transistor 70 is inserted in order to prevent the elements of the write gates 13-1, 13-2 and 13-3, equalize gates 15-1, 15-2 and 15-3 and differential amplifiers 17-1, 17-2 and 17-3 from being destroyed by applying a write potential (e.g., 7 V) of an internal power supply VBP to the elements in write operation. For example, the barrier transistor 70 is configured by a source-follower-connected high-withstanding transistor. An internal power supply VBT of a second internal power supply potential (e.g., 3 V), which is the output of an internal power supply 50', is connected to the gate of the barrier transistor 70.

The internal power supply voltage VBP is applied to one terminal (source and drain) of each of the anti-fuse storage elements 11-1, 11-2 and 11-3 to which data has been written and then to storage nodes SN0, SN1 and SN2 on the other terminal (gate) thereof. In some cases, the potential of each of the storage nodes SN0, SN1 and SN2 may reach the internal power supply voltage VBP. This high-voltage stress is likely to destroy the write gates 13-1, 13-2 and 13-3, equalize gates 15-1, 15-2 and 15-3 and differential amplifiers 17-1, 17-2 and 17-3. To prevent this, these gates and amplifiers have to be configured by high-withstanding transistors; however, these transistors do not always have enough withstanding voltage for the internal power supply voltage VBP in write operation.

The barrier transistor 70 is therefore effective in resolving the problem described above. The barrier transistor 70 can prevent the internal power supply voltage VBP from being transmitted to the storage nodes SN0, SN1 and SN2 in write operation. In the sixth embodiment, the potential of each of the storage nodes SN0, SN1 and SN2 can be decreased to a value close to the internal power supply voltage VBT. Since the gate of the barrier transistor 70 is held at a relatively high internal power supply voltage VBT, voltage stress is mitigated to prevent the elements from being destroyed. Moreover, the internal power supply voltage VBT is applied to the gate of the barrier transistor 70 to prevent the read signal (output data) from being degraded due to the phenomenon of "Vt drop."

In the sixth embodiment, a read operation control sequential circuit 33' is configured to output a VBT control signal VBTE. Upon receiving the VBT control signal VBTE, the internal power supply 50' generates an internal power supply voltage VBT and an internal power supply voltage VBP.

Figure 22:
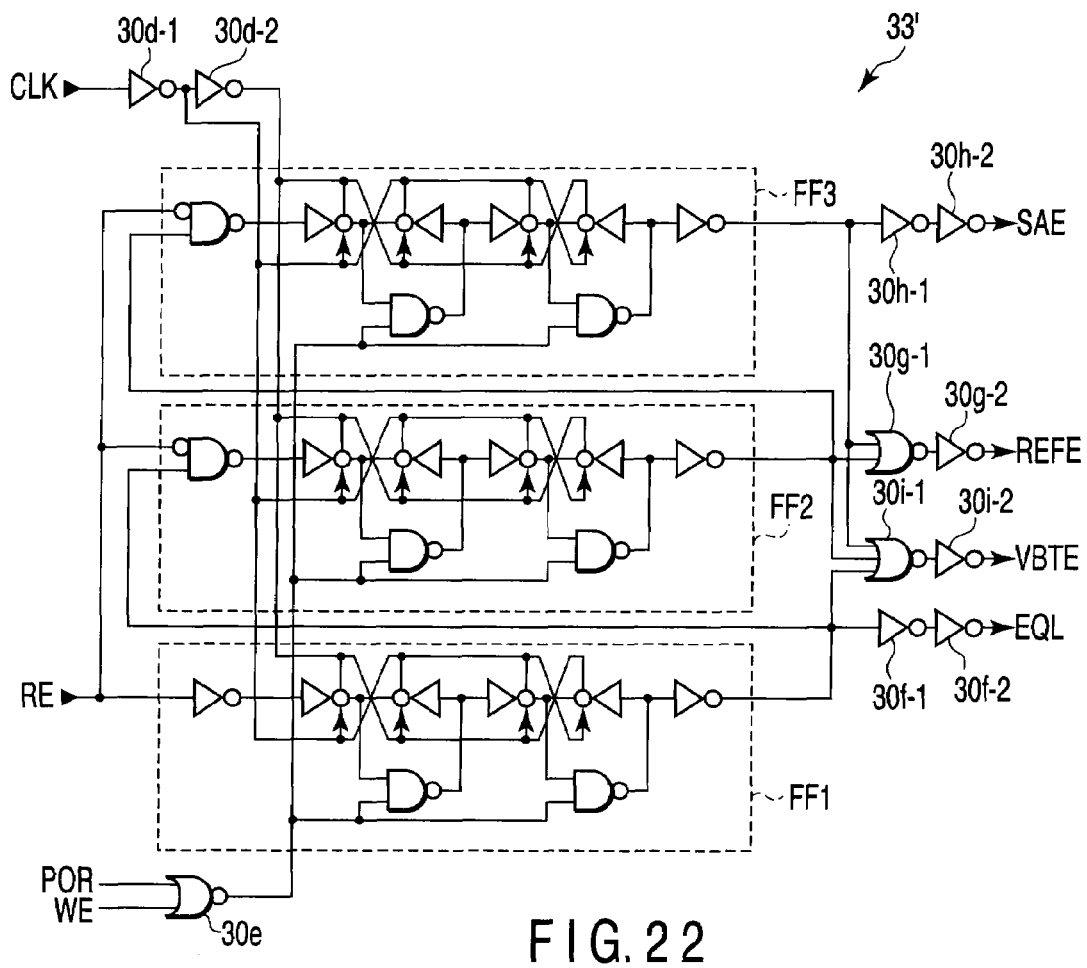
FIG. 22 is a circuit diagram showing a configuration of a read operation control sequential circuit in the memory shown in FIG. 21.
Figure 23:
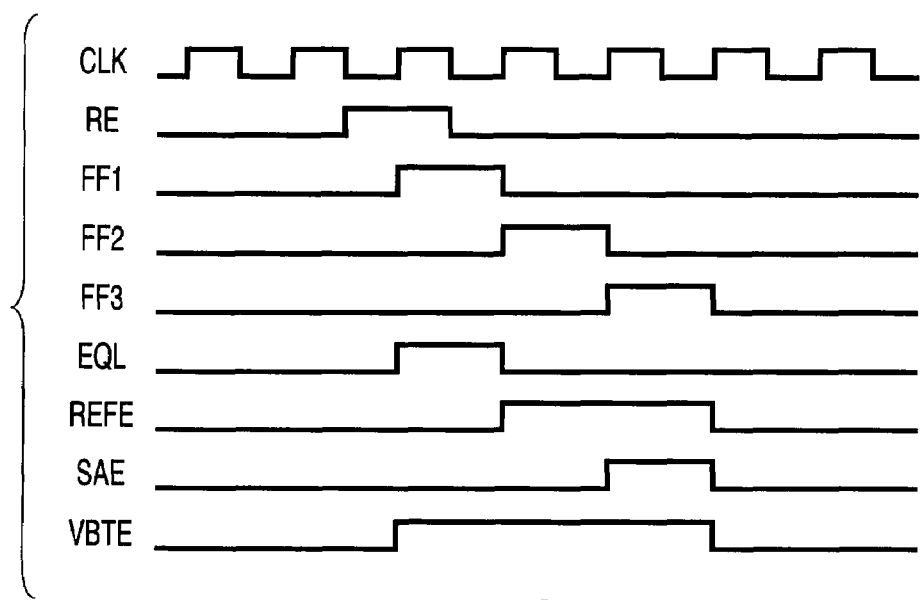
FIG. 23 is a timing chart illustrating the operation of the read operation control sequential circuit shown in FIG. 22.

FIG. 22 shows an example of the read operation control sequential circuit 33' described above. Since the circuit 33' has almost the same configuration as that of the read operation control sequential circuit 33 according to the fifth embodiment shown in FIG. 17, each component common to the circuits 33 and 33' is denoted by the same reference numeral and its detailed description is omitted. In the circuit 33', the output of the NOR circuit 30i-1 is taken out through the inverter 30i-2, as shown in FIG. 22. The output is thus used as a VBT control signal VBTE in place of the above VBP direct drive signal VBPDD. As shown in FIG. 23, the VBT control signal VBTE is activated together with the equalize signal EQL when the flip-flop FF1 of the first stage captures the read operation instruction signal RE at the rise of the external input clock CLK. The VBT control signal VBTE is returned to an inactive state at the timing after the next, next timing of the external input clock CLK together with the differential amplifier control signal SAE and reference potential control signal REFE.

Figure 24:
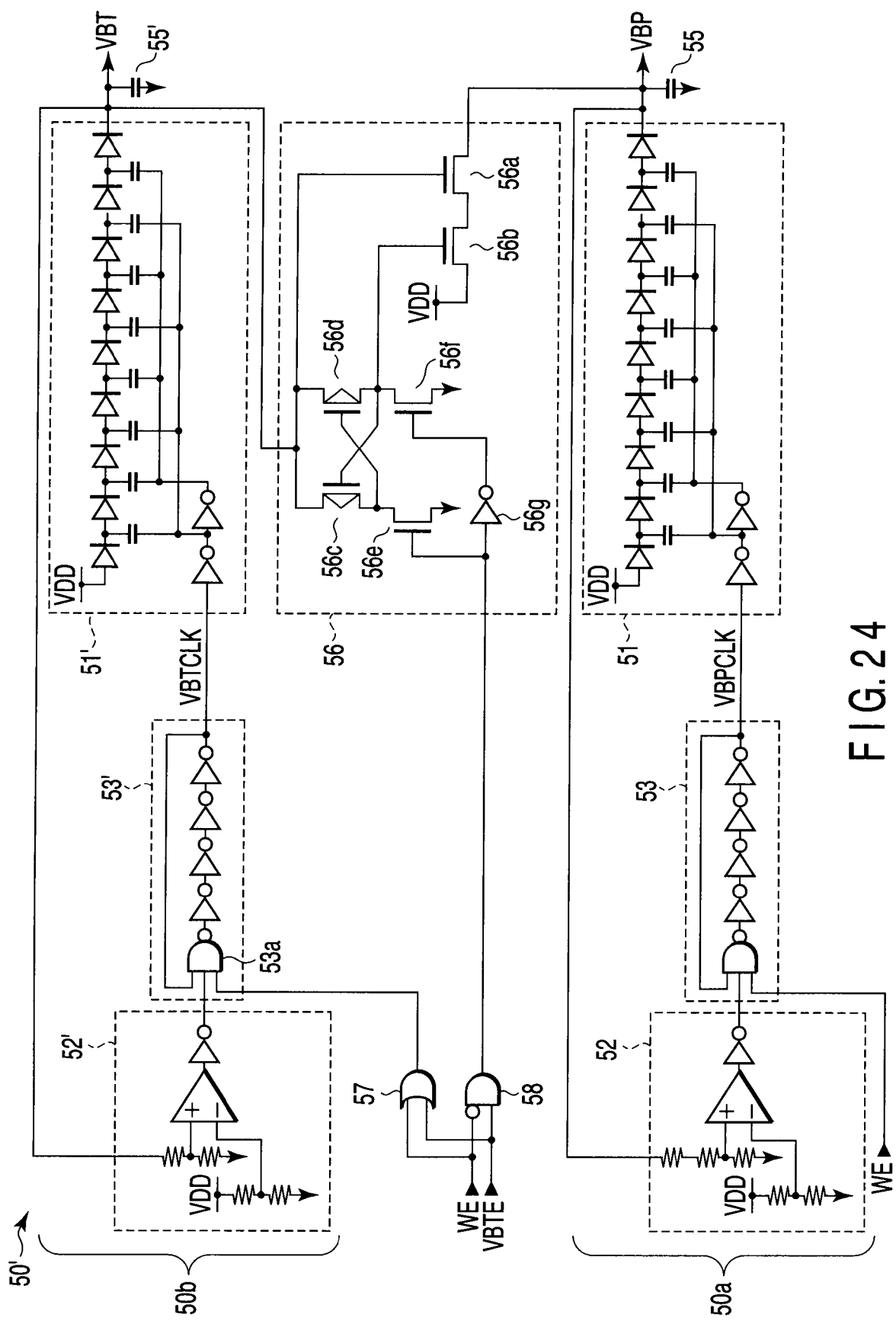
FIG. 24 is a circuit diagram showing a configuration of an internal power supply in the memory shown in FIG. 21.

FIG. 24 shows an example of the configuration of the internal power supply 50' described above. Each component common to the internal power supply 50' and the internal power supply 50 shown in FIG. 20 is denoted by the same reference numeral and its detailed description is omitted. The internal power supply 50' includes step-up power supplies 50a and 50b as shown in FIG. 24.

The step-up power supply 50a generates a high voltage (e.g., internal power supply voltage VBP=7 V) from a logic power supply voltage (e.g., power supply voltage VDD=1.5 V). The high voltage is a write potential that is necessary for writing data to the anti-fuse storage elements 11-1, 11-2 and 11-3. The step-up power supply 50a includes a charging pump 51 for generating the above write potential, a potential control circuit 52 for controlling the potential of the internal power supply voltage VBP, and an oscillator 53 for giving pumping timing to the charging pump 51.

The step-up power supply 50b generates an internal power supply voltage VBT for preventing the barrier transistor 70 from being destroyed. This voltage VBT is applied to the gate of the barrier transistor 70. The step-up power supply 50b has almost the same configuration as that of the above step-up power supply 50a, and includes a charging pump 51' for generating the above internal power supply voltage VBT, a potential control circuit 52' for controlling the potential of the internal power supply voltage VBT, and an oscillator 53' for giving pumping timing to the charging pump 51'. In the step-up power supply 50b, however, the first input terminal of a NAND circuit 53a of the oscillator 53' is supplied with an OR output of the above signals WE and VBTE through an OR circuit 57. Thus, the step-up power supply 50b generates the internal power supply voltage VBT when the VBT control signal VBTE is "1."

The internal power supply 50' generates a read potential (e.g., VBP=1.5 V) in read operation. This read potential is one necessary for reading data out of the anti-fuse storage elements 11-1, 11-2 and 11-3 efficiently without destroying the storage elements or the data stored therein. The internal power supply VBT in read operation is the same (e.g., 3 V) as that in write operation.

In the internal power supply 50' shown in FIG. 24, the internal power supply VBP and logic power supply (VDD) are short-circuited in read operation to generate a read potential necessary for the read operation. The internal power supply 50' also includes a short circuit 56. The short circuit 56 includes source-follower-connected N-type MOS transistors 56a and 56b, P-type MOS transistors 56c and 56d, N-type MOS transistors 56e and 56f, and an inverter 56g. The short circuit 56 is supplied with an AND output of the inverted input of the write operation instruction signal WE and the VBT control signal VBTE through an AND circuit 58 one input terminal of which is an inverting input terminal.

The output terminal of the AND circuit 58 is connected to the gate of the N-type MOS transistor 56e and the input terminal of the inverter 56g. The source of the N-type MOS transistor 56e is grounded (connected to the ground potential VSS), and the drain thereof is connected to the drain of the P-type MOS transistor 56c and the gate of the P-type MOS transistor 56d. The output terminal of the inverter 56g is connected to the gate of the N-type MOS transistor 56f. The source of the N-type MOS transistor 56f is grounded (connected to the ground potential VSS), and the drain thereof is connected to the gate of the P-type MOS transistor 56c, the drain of the P-type MOS transistor 56d, and the gate of the N-type MOS transistor 56b. The source of the N-type MOS transistor 56b is connected to the logic power supply (VDD), and the drain thereof is connected to the source of the N-type MOS transistor 56a. The drain of the N-type MOS transistor 56a is connected to the output terminal of the step-up power supply 50a. The gate of the N-type MOS transistor 56a and the sources of the P-type MOS transistors 56c and 56d are connected to the output terminal (internal power supply VBT) of the step-up power supply 50b.

If a short circuit is configured by a source-follower-connected N-type MOS transistor, generally, a source-to-drain potential cannot efficiently be transmitted due to the phenomenon of "Vt drop". In the short circuit 56 shown in FIG. 24, the internal power supply VBT is used to control the gate of the source-follower-connected N-type MOS transistor 56a, thereby preventing the phenomenon of "VT drop" from occurring.

As in the fifth embodiment, the internal power supply 50' of the sixth embodiment is configured to control the generation of a write potential and the stop of the generation in accordance with the state of the write operation instruction signal WE. Even though the sequential circuit is brought into an unexpected state by a sudden stop of power (instantaneous power failure) or the influence of radiation, the internal power supply 50' can be prevented from generating a write potential accidentally. In other words, even though a write operation instruction signal WE is input erroneously during read operation, the inhibition of write potential can prevent data from being written erroneously.

Particularly when the write operation instruction signal WE is "1," the internal power supply voltage VBP becomes a write potential (e.g., 7 V) and at the same time the internal power supply voltage VBT (e.g., 3 V) is always generated. This is because the application of the internal power supply voltage VBT to the gate of the barrier transistor 70 prevents the barrier transistor 70 itself from being destroyed by applying a high internal power supply voltage VBP. Assume here that no internal power supply voltage VBT is generated but the potential of the internal power supply voltage VBP is heightened while the potential of the gate of the barrier transistor 70 remains at 0 V. Then, a high-voltage stress (e.g., 7 V) is applied between the gate and drain of the barrier transistor 70 and consequently it is feared that the barrier transistor 70 may be destroyed. Whenever the internal power supply voltage VBP is heightened, the internal power supply voltage VBT has to be done. Highest priority is given to this operation. If a write operation instruction signal WE is input erroneously during read operation, the read operation is reset, and the internal power supply voltage VBP is heightened, as is the internal power supply voltage VBT at the same time. The elements including the barrier transistor 70 can thus be prevented from being destroyed.

As in the fifth embodiment, the fixation of the write operation instruction signal WE to an inactive state (e.g., 0 V) makes it possible to avoid the risk that the circuit will be caused to malfunction by a sudden stop of power and the influence of radiation to lose stored data and destroy the elements of the circuit. If a write operation instruction signal WE is input erroneously in particular, the read operation is reset promptly and the memory stands by for a stable write operation, thereby preventing the risk that the stored data will be lost and the elements will be destroyed.

According to the sixth embodiment, too, when the memory is sealed with a package or mounted on a board, a write operation instruction signal WE can be supplied directly to the ground potential VSS (e.g., 0 V) to reduce the risk of erroneous writing greatly. In other words, data can be prevented from being written erroneously even when power is suddenly stopped (instantaneous power failure) or a soft error is caused in the internal node by the influence of radiation.

The above first to sixth embodiments have been described, taking a one-time programmable memory using an anti-fuse storage element as an example, since the need for preventing data from being written erroneously is the most intense and the advantage of doing the same can be clarified. The present invention is not limited to the one-time programmable memory but can be applied to a logic-incorporated nonvolatile semiconductor memory device as well as a semiconductor chip such as a NAND flash erasable programmable read only memory (EPROM). The same advantages as those of the one-time programmable memory can be obtained from such a nonvolatile semiconductor memory device. The logic-incorporated nonvolatile semiconductor memory device brings a greater advantage because a high-performance power-on reset circuit is difficult to mount on the device due to the constraints of the area of a chip. The same advantage can thus be obtained from various nonvolatile semiconductor memory devices irrespective of the arrangement of storage elements, the number of bits (the number of elements) and the pattern of mounting.

Particularly in a memory having storage elements for a plurality of bits, a write operation control combination (sequential) circuit need not be provided for each of the storage elements, but can be configured such that it is shared by the storage elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
 a nonvolatile storage element to which data is inhibited from being rewritten;
 a read operation control circuit which captures a read operation instruction signal in synchronization with an external input clock, the read operation instruction signal giving an instruction to start a read operation to read data out of the nonvolatile storage element;
 a write operation control circuit to which a write operation instruction signal is input asynchronously with the external input clock, the write operation instruction signal giving an instruction to start a write operation to write data to the nonvolatile storage element; and
 a reset circuit which resets an operation of the read operation control circuit upon receiving the write operation instruction signal.

2. The nonvolatile semiconductor memory device according to claim 1, wherein the write operation control circuit stands by for the write operation if the write operation instruction signal supplied to the reset circuit is active while the read operation control circuit is operating.

3. The nonvolatile semiconductor memory device according to claim 1, further comprising an internal power supply which generates a write potential to write data to the nonvolatile storage element, and
 wherein the write operation control circuit stands by for the write operation before the internal power supply generates a write potential if the write operation instruction signal supplied to the reset circuit is active while the read operation control circuit is operating.

4. The nonvolatile semiconductor memory device according to claim 1, wherein the nonvolatile storage element includes nonvolatile storage elements the number of which corresponds to the number of bits of the data.

5. The nonvolatile semiconductor memory device according to claim 1, further comprising a differential amplifier which detects data read out of the nonvolatile storage element in comparison with a reference potential.

6. The nonvolatile semiconductor memory device according to claim 1, further comprising:
 a differential amplifier which detects data read out of the nonvolatile storage element in comparison with a reference potential; and
 an output buffer which outputs an output of the differential amplifier in synchronization with the external input clock.

7. The nonvolatile semiconductor memory device according to claim 1, wherein the nonvolatile storage element is connected to the write operation control circuit via a write gate.

8. The nonvolatile semiconductor memory device according to claim 7, further comprising a barrier transistor between the nonvolatile storage element and the write gate, the barrier transistor being configured by a source-follower-connected high-withstanding transistor.

9. The nonvolatile semiconductor memory device according to claim 1, wherein the nonvolatile storage element is connected to the read operation control circuit via an equalize gate.

10. The nonvolatile semiconductor memory device according to claim 1, wherein the nonvolatile storage element is an irreversible gate-oxide-film destruction type anti-fuse.

11. The nonvolatile semiconductor memory device according to claim 1, wherein the read operation control circuit includes a sequential circuit and the write operation control circuit includes a combination logic circuit.

12. The nonvolatile semiconductor memory device according to claim 1, wherein the read operation control circuit and the write operation control circuit each include a sequential circuit.

13. A nonvolatile semiconductor memory device comprising:
- a nonvolatile storage element to which data is inhibited from being rewritten;
- an oscillator to which a read operation instruction signal is input in synchronization with an external input clock, the read operation instruction signal giving an instruction to start a read operation to read data out of the nonvolatile storage element;
- a read operation control circuit which captures an internal read operation instruction signal output from the oscillator, as the read operation instruction signal, in synchronization with an internal clock of the oscillator;
- a write operation control circuit to which a write operation instruction signal is input asynchronously with the external input clock, the write operation instruction signal giving an instruction to start a write operation to write data to the nonvolatile storage element; and
- a reset circuit which resets an operation of the read operation control circuit upon receiving the write operation instruction signal.

14. The nonvolatile semiconductor memory device according to claim 13, wherein the write operation control circuit stands by for the write operation if the write operation instruction signal supplied to the reset circuit is active while the read operation control circuit is operating.

15. The nonvolatile semiconductor memory device according to claim 13, further comprising an internal power supply which generates a write potential to write data to the nonvolatile storage element, and
wherein the write operation control circuit stands by for the write operation before the internal power supply generates a write potential if the write operation instruction signal supplied to the reset circuit is active while the read operation control circuit is operating.

16. The nonvolatile semiconductor memory device according to claim 13, further comprising a differential amplifier which detects data read out of the nonvolatile storage element in comparison with a reference potential.

17. The nonvolatile semiconductor memory device according to claim 13, wherein the nonvolatile storage element is connected to the write operation control circuit via a write gate.

18. The nonvolatile semiconductor memory device according to claim 13, wherein the nonvolatile storage element is connected to the read operation control circuit via an equalize gate.

19. The nonvolatile semiconductor memory device according to claim 13, wherein the nonvolatile storage element is an irreversible gate-oxide-film destruction type anti-fuse.

20. The nonvolatile semiconductor memory device according to claim 13, wherein the read operation control circuit includes a sequential circuit and the write operation control circuit includes a combination logic circuit.

* * * * *